(12) United States Patent
Uchino et al.

(10) Patent No.: US 7,501,743 B2
(45) Date of Patent: Mar. 10, 2009

(54) PIEZOELECTRIC ULTRASONIC MOTOR FOR 2-DIMENSIONAL POSITIONING

(75) Inventors: Kenji Uchino, State College, PA (US); Clive A. Randall, State College, PA (US); Jose Agraz, La Jolla, CA (US); Richard Eitel, State College, PA (US); Seung-Ho Park, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 11/741,227

(22) Filed: Apr. 27, 2007

(65) Prior Publication Data

US 2007/0252477 A1    Nov. 1, 2007

Related U.S. Application Data

(60) Provisional application No. 60/796,009, filed on Apr. 28, 2006.

(51) Int. Cl.
    *H01L 41/083*    (2006.01)
(52) U.S. Cl. ..................... 310/328; 310/367; 310/358
(58) Field of Classification Search ............ 310/323.16, 310/367, 358, 323.02, 328
    See application file for complete search history.

(56) References Cited

U.S. PATENT DOCUMENTS 4,622,483 A    11/1986    Staufenberg, Jr. et al.

| 4,912,351 A | 3/1990 | Takata et al. |
| 4,945,275 A | 7/1990 | Honda et al. |
| 6,242,849 B1 | 6/2001 | Burov et al. |

(Continued)

FOREIGN PATENT DOCUMENTS

JP    63316676    12/1988

OTHER PUBLICATIONS

Shuxiang*, H. W. Kim, M. T. Strauss #, K. Uchino and D. Viehiand, "A Piezoelectric Shear-Shear Mode Ultrasonic Motor", ICAT/Materials ResearchInstitute, The Pennsylvania State University, University Park, PA 16801 USA, Apr. 2004; *Materials Science & Engineering, Virginia Tech, Blacksburg, VA 24061, USA; #HME. 56 Federal Street, Newbury port, MA 01950, USA. cited by other.

(Continued)

*Primary Examiner*—Darren Schuberg
*Assistant Examiner*—Bryan P Gordon
(74) *Attorney, Agent, or Firm*—Gifford, Krass, Sprinkle, Anderson & Citkowski

(57) ABSTRACT

A piezoelectric ultrasonic motor having 2-dimensional positioning movement includes a stator. The stator includes a piezoelectric ceramic bar and an electrode disposed on the bar. Each bar includes two wings that are separated by a predetermined angle to form a predetermined shape. A power source is used to apply a voltage to the stator to excite a bending mode vibration in the each of the wings, and the combined motion of the two wings produces an elliptical motion at a tip of the wing. A load is operatively connected to the stator, such that a portion of the load in contact with the stator is driven to move linearly through a frictional force between the load and the stator, due to the elliptical motion at the tip of the wing.

18 Claims, 23 Drawing Sheets

U.S. PATENT DOCUMENTS 6,288,475 B1 9/2001 Ito et al.
6,518,689 B2 2/2003 Yerganian
6,657,362 B2 * 12/2003 Matsuo et al. ......... 310/323.02

OTHER PUBLICATIONS

S. Park, K. Uchino, A. Baker, C. Randall, R. Eitel, 2-degrees of Freedom Ultrasonic Motors Co-sintered with Low Temperature Cofired Ceramics (LTCC), 2 pages.

S.Park, J. Agraz, S. Tuncdemir, Y. Kim, R. Eitel, A. Baker, C. Randall, K. Uchino; Delta-shaped Piezoelectric Ultrasonic Motor for 2-Dimensional Positioning, 25 pages.

S. Park, S. Tuncdemir, K. Uchino, R. Eitel, A. Baker, C. Randall; Low Tempearture Co-fired Ceramic (LTCC) Compatible Delta-shape Ultrasonic Motor, 1 page.

S. Park, J. Harris, A. Baker, R. Eitel, C. Randall, K. Uchino; "Low Temperature Cofired Ceramics (LTCC) Compatible Ultrasonic Motors," Oct. 18, 2006, 24 pages.

S. Park, Y. Kim, J. Harris, S. Tuncdemir, R. Eitel, A. Baker, C. Randall, K. Uchino; "Low Temperature Cofired Ceramic (LTCC) Compatible Ultrasonic Motors," 5 pages.

* cited by examiner

Table 1. L Shape Piezoelectric MotorDesigns — 50

| Slave Wing High End Size | Slave Wing Length | Master Wing Right End Size | Master Wing Length | Low End (Hz) Amplitude | Low End (Hz) Frequency | High End (Hz) Amplitude | High End (Hz) Frequency | BW | Amp at Midrange |
|---|---|---|---|---|---|---|---|---|---|
| 1 | 10 | 1 | 10 | 8.14E-04 | 71400 | 3.77E-04 | 97500 | 26100 | 1.67E-04 |
| 1.5 | 10 | 1.5 | 10 | 3.81E-04 | 77400 | 2.51E-04 | 104000 | 26600 | 6.73E-04 |
| 2 | 10 | 2 | 10 | 7.15E-04 | 83400 | 5.53E-04 | 112000 | 28600 | 2.15E-04 |
| 2.5 | 10 | 2.5 | 10 | 5.03E-04 | 87400 | 4.46E-04 | 116000 | 28600 | 2.46E-04 |
| 3 | 10 | 3 | 10 | * | * | * | * | * | * |
| 1 | 10 | 1 | 10 | * | * | * | * | * | * |
| 1.5 | 10 | 1.5 | 10 | 2.41E+00 | 73400 | 2.40E-04 | 81400 | 8000 | 1.04E-04 |
| 2 | 10 | 2 | 10 | 1.14E-04 | 81400 | 2.98E-04 | 89400 | 8000 | L04E-04 |
| 2.5 | 10 | 2.5 | 10 | 8.61E-04 | 87400 | 8.79E-04 | 97500 | 10100 | 171E-04 |
| 3 | 10 | 3 | 10 | 9.36E-03 | 91500 | 4.26E-04 | 104000 | 12500 | 1,71E-04 |
| 3.5 | 10 | 3.5 | 10 | 1.12E-03 | 95500 | 9.18E-03 | 108000 | 12500 | 3.00E-04 |
| 4 | 10 | 4 | 10 | 1.08E-03 | 97500 | 8.65E-03 | 112000 | 14500 | 3.00E-04 |
| 4 | 10 | 4 | 10 | 7.57E-04 | 99500 | 8.13E-04 | 116000 | 16500 | 3.00E-04 |
| 2.5 | 10 | 2.5 | 9.5 | * | * | * | * | * | * |
| 2.5 | 10 | 2.5 | 9 | 2.19E-03 | 94000 | 1.27E-03 | 106500 | 12500 | 2.13E-04 |
| 2.5 | 10 | 2.5 | 8.5 | 1.09E-03 | 97000 | 5.29E-03 | 110000 | 13000 | 2.06E-04 |
| 1 | 10 | 4 | 10 | 1.18E-03 | 102000 | 3.29E-03 | 114000 | 12000 | 1.90E-04 |
| 1 | 10 | 8 | 11 | 1.06E-03 | 91000 | 5.16E-03 | 99000 | 8000 | 3.04E-04 |
| 1 | 10 | 7 | 11 | 8.25E-04 | 66900 | 6.80E-04 | 60500 | -6400 | 3.94E-04 |
| 2 | 10 | 8 | 11 | 9.72E-04 | 66000 | 1.27E-03 | 60000 | -6000 | 4.18E-04 |
| 1 | 10 | 5 | 10 | 3.29E-03 | 95000 | 4.61E-03 | 72000 | -23000 | 4.51E-04 |
| 0.5 | 10 | 6 | 10 | 3.83E-03 | 95000 | 2.42E-03 | 101000 | 6000 | 3.92E-04 |
| 1 | 10 | 6 | 10 | * | * | * | * | * | * |
| 1 | 10 | 6 | 11 | 1,79E-03 | 97400 | 1.06E-03 | 103400 | 6000 | 7.03E-04 |
| 1 | 10 | 6 | 12 | 3,00E-03 | 89000 | 2.97E-03 | 97000 | 8000 | 5.11E-04 |
| 1 | 10 | 6 | 13 | 1.87E-03 | 83000 | 1.5SE-03 | 92000 | 9000 | 4.83E-04 |
| 1 | 10 | 6 | 14 | 2.07E-03 | 78200 | 3.89E-03 | 87200 | 9000 | 5.00E-04 |
| 1 | 10 | 6 | 14 | 2.48E-03 | 74000 | 6.77E-03 | 82400 | 8400 | 5.00E-04 |

FIG - 4a

Linear PZT motor

| Slave Wing | | Master Wing | | Low End (Hz) | | High End (Hz) | | | |
|---|---|---|---|---|---|---|---|---|---|
| High End Size | Length | Right End Size | Length | Amplitude | Frequency | Amplitude | Frequency | BW | Amp at Midrange |
| 1 | 10 | 5 | 14 | 2.66E-03 | 72800 | 3.16E-03 | 80000 | 7200 | 5.19E-04 |
| 1 | 10 | 4 | 14 | 3.74E-03 | 71600 | 5.62E-03 | 77600 | 6000 | 3.52E-04 |
| 1 | 10 | 3 | 14 | 2.39E-03 | 69800 | 3.96E-03 | 74600 | 4800 | 2.61E-04 |
| 1 | 10 | 2 | 14 | 1.99E-03 | 66800 | 1.75E-03 | 71000 | 4200 | 1.47E-04 |
| 1 | 10 | 1 | 14 | 9.05E+00 | 62000 | 1.40E-04 | 67400 | 5400 | 8.55E-05 |
| 1 | 10 | 0.5 | 14 | 3.68E-03 | 57800 | 1.61E-04 | 62600 | 4800 | 1.10E-04 |
| 1 | 10 | 1 | 14 | * | 62600 | * | 75200 | 12600 | * |
| 1 | 10 | 1 | 14 | 4.11E-04 | 41600 | 3.43E-04 | 59600 | 18000 | * |
| 0.5 | 9 | 0.5 | 13 | 1.59E-04 | 66200 | 2.19E-03 | 58400 | -7800 | 2.19E-05 |
| 1 | 10 | 0 | 15 | 1.57E-04 | 29000 | 5.25E-04 | 41600 | -12600 | 1.44E-04 |

*FIG—4b*

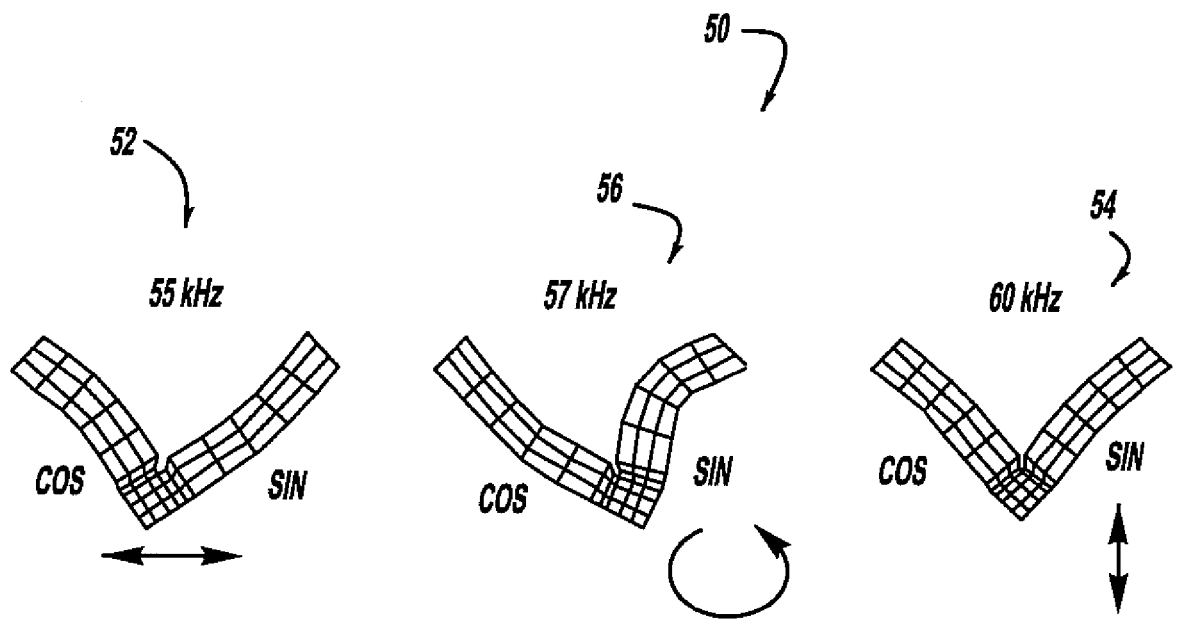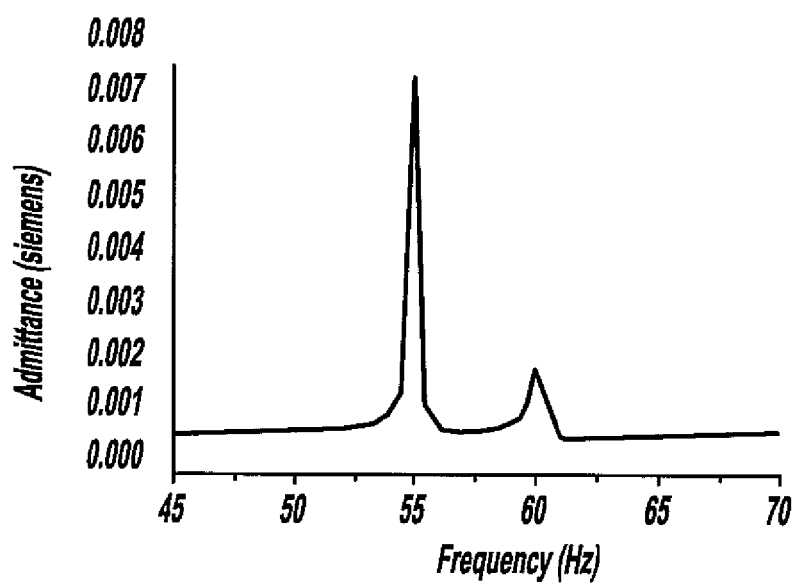
FIG - 10

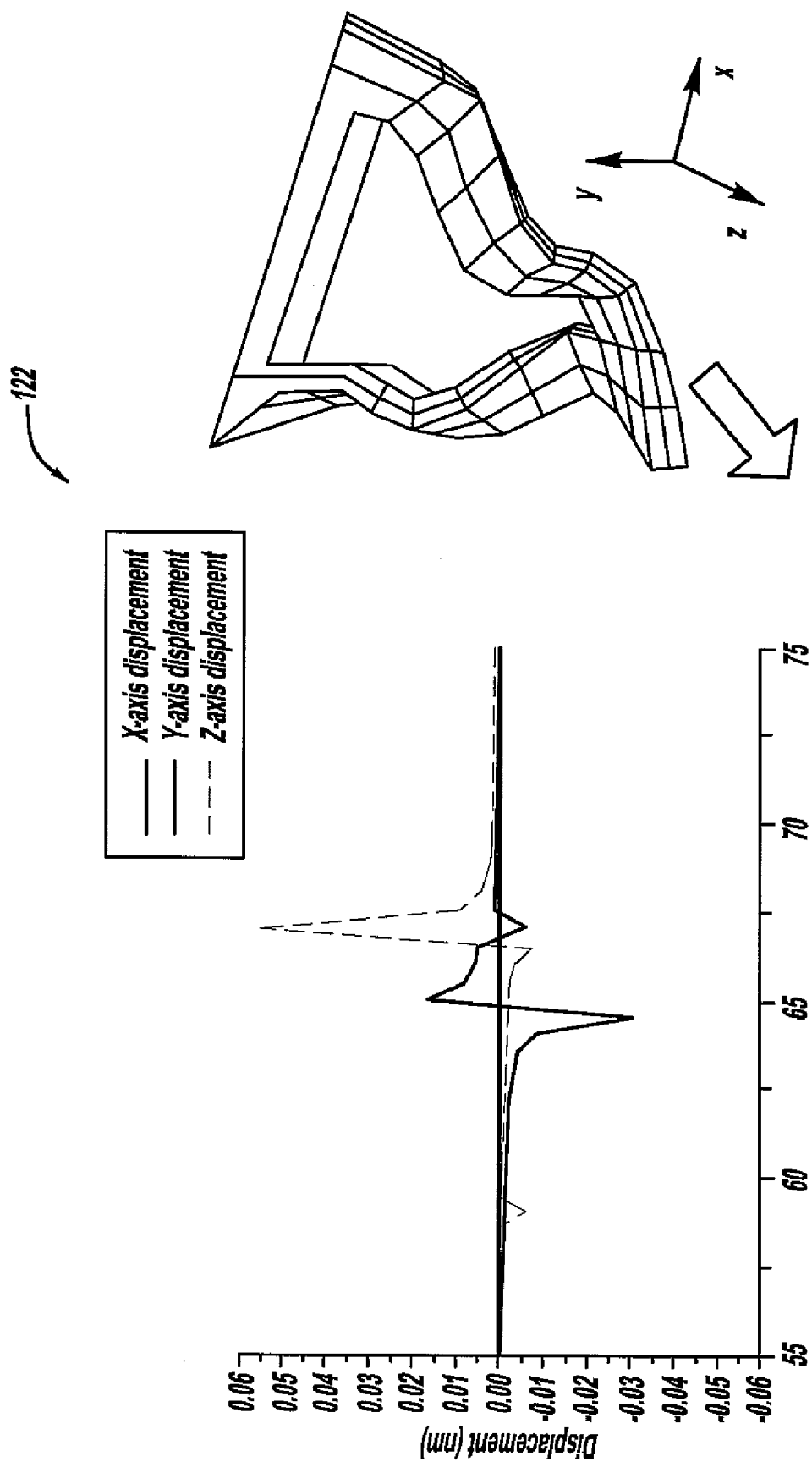

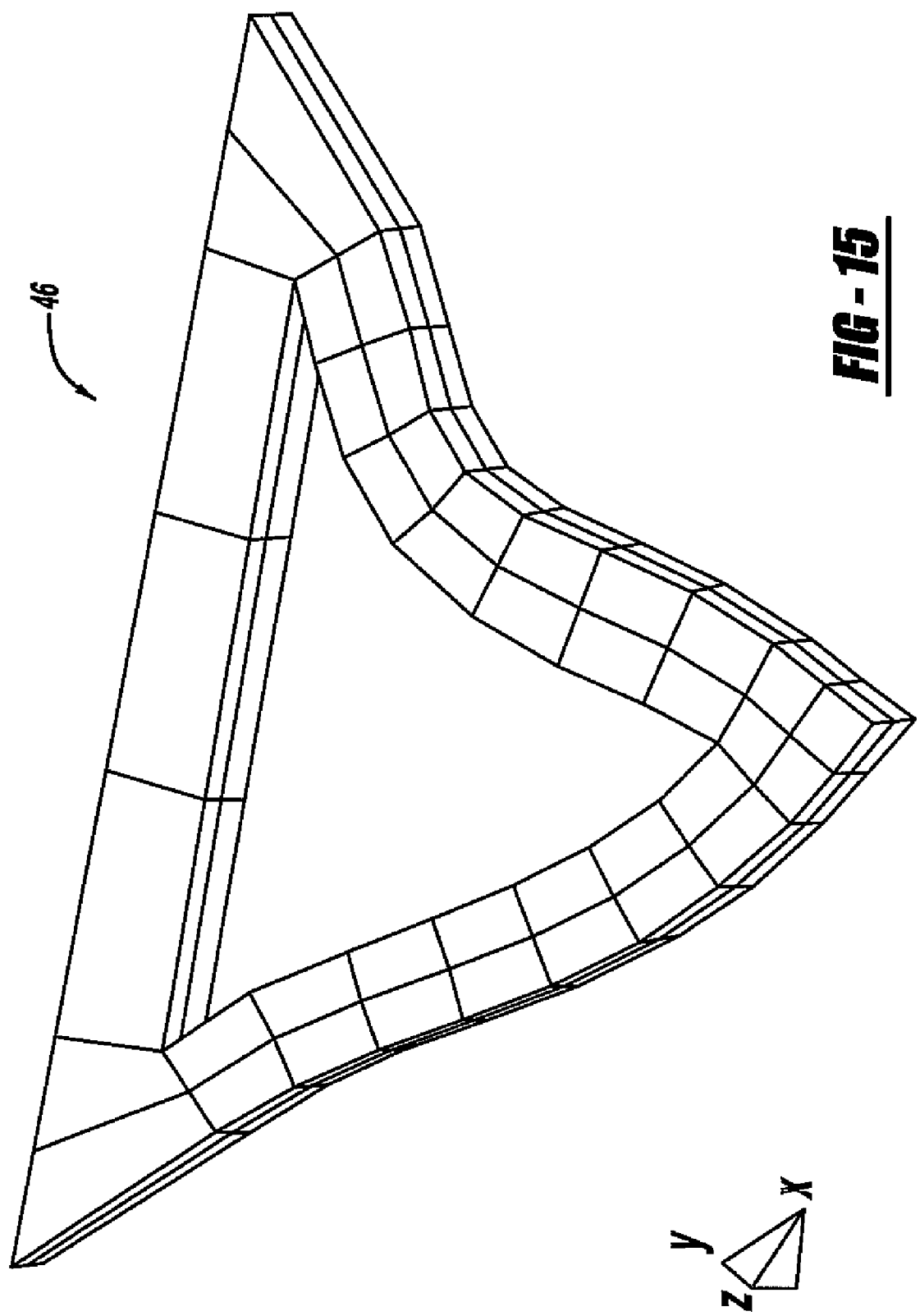

| Electrode<br>Direction | 1 | 2 | 3 | 4 |
|---|---|---|---|---|
| +x | SIN | COS | SIN | COS |
| -x | COS | SIN | COS | SIN |
| +z | COS | COS | SIN | SIN |
| -z | SIN | SIN | COS | COS |
| +x and +z | SIN | COS | SIN | SIN |
| +x and -z | SIN | SIN | SIN | COS |
| -x and +z | COS | SIN | SIN | SIN |
| -x and -z | SIN | SIN | COS | SIN |

FIG-19

PIEZOELECTRIC ULTRASONIC MOTOR FOR 2-DIMENSIONAL POSITIONING

RELATED APPLICATIONS

This application claims priority of U.S. Provisional Patent Application Ser. No. 60/796,009 filed Apr. 28, 2006, which is incorporated herein by reference.

BACKGROUND OF THE INVENTION

1. Field of the Invention

The present invention relates generally to a miniature piezoelectric motor, and in particular to a piezoelectric ultrasonic motor for 2-dimensional positioning.

2. Description of the Related Art

Piezoelectric ultrasonic motors with their exceptional properties, such as fast response, high precision, absence of parasitic magnetic fields, frictional locking at the power-off stage, high power-to-weight ratio, and smaller package size as compared to conventional electromagnetic motors, are readily adaptable for use in a variety of electronic devices. These devices range from compact, consumer electronic devices, such as cellular phones, digital cameras, computers, video recorders, to optoelectronic devices used in optical communications. The popularity of these types of electronic devices continues to influence the development of low cost, simple, and more compact piezoelectric ultrasonic motors.

The characteristics of a piezoelectric motor, including a faster response time, a high power-to-weight ratio, no extrinsic or intrinsic magnetic fields and smaller packaging capability, male them advantageous over a conventional electromagnetic motor. However, in the past their use has been compromised by other characteristics, including the need for high voltage, high frequency power sources, and potential wear at the rotor/stator interface.

The piezoelectric motor operates using a ferroelectric ceramic element to excite ultrasonic vibrations in a stator structure. The elliptical movement of the stator is converted into the motion of a sliding plate in frictional contact with the stator. The resulting movement is either rotational or linear, depending on the design of the structure. A conventional piezoelectric ultrasonic motor can generally be classified into two classes: 1) elliptical motion at the motor tip ultrasonic motors, and 2) standing wave ultrasonic motors. The disc-type or ring-type elliptical motion at the motor tip (rotary motor) may be fabricated from a piezoelectric disc (or ring) and a metal disc. The operation of the linear piezoelectric motor is based on the excitation of a longitudinal and a superimposed bending mode of a rectangular piezoelectric plate, to achieve the elliptic motion at the driving tip of the motor.

Previous linear ultrasonic motors were driven by the elliptic motion of the combined displacement of longitudinal (d31) and secondary bending modes. These motors generally operated according to the principle, that at a certain distance-to-length ratio of a rectangular-shaped piezoelectric ceramic plate, the resonant frequencies of first longitudinal and second bending modes coincide with each other. The elliptic motion at the motor tip is obtained by the combination of the two vibrations. Another example of a linear piezoelectric motor uses vibrators at right angles. However, this motor exhibited higher thrusts and speed than other motors.

While these previously described piezoelectric ultrasonic motors work in products where a small displacement with high accuracy is desirable, their use is restricted by the associated manufacturing costs. Thus, there is a need in the art for a simple, low cost, compact piezoelectric linear ultrasonic motor for 2-dimensional motion.

SUMMARY OF THE INVENTION

Accordingly, the present invention is a piezoelectric ultrasonic motor having 2-dimensional positioning movement. The motor includes a stator formed using a piezoelectric ceramic bar and an electrode disposed thereon. The ceramic bar includes two wings that are separated by a predetermined angle to form a predetermined shape. A power source is used to apply a voltage to the stator to excite a bending mode vibration in the each of the wings, and the combined motion of the two wings produces an elliptical motion at a tip of the wing. A load is operatively connected to the stator, such that a portion of the load in contact with the stator is driven to move linearly through a frictional force between the load and the stator, due to the elliptical motion at the tip of the wing.

One advantage of the present invention is that a piezoelectric ultrasonic motor for 2-dimensional motion is provided. Another advantage of the present invention is that the motor can be produced at a lower cost than other piezoelectric motors. A further advantage of the present invention is that the electrical to mechanical conversion rate of the motor is increased, so that the motor can be miniaturized. Still a further advantage of the present invention is that the piezoelectric ceramic plate may have a symmetric shape or an asymmetric shape. Still yet a further advantage of the present invention is that the piezoelectric ultrasonic motor may be fabricated using a ceramic material. Still yet a further advantage of the present invention is that the piezoelectric motor may provide increased accuracy of motion in an optoelectronic device.

Other features and advantages of the present invention will be readily appreciated, as the same becomes better understood after reading the subsequent description taken in conjunction with the accompanying drawings.

BRIEF DESCRIPTION OF THE DRAWINGS

FIG. 4 is a table illustrating the effect of wing shape on the L-shaped motor of FIG. 2, according to the present invention.

FIG. 10 is a view illustrating the motion of the Λ-shaped motor due to variations in frequency, according to the present invention.

FIGS. 14a-14c are graphs illustrating a FEM simulation result for 2-dimensional driving of the Δ-shape piezoelectric motor along the (a) x-axis and (b) y-axis and (c) diagonal movement, according to the present invention.

FIG. 15 is a view illustrating the displacement movement with applied voltage for the motor of FIG. 12, according to the present invention.

FIG. 19 is a table illustrating driving conditions for the bimorph Δ-shaped motor, according to the present invention.

DESCRIPTION OF THE PREFERRED EMBODIMENT(S)

Figure 1:
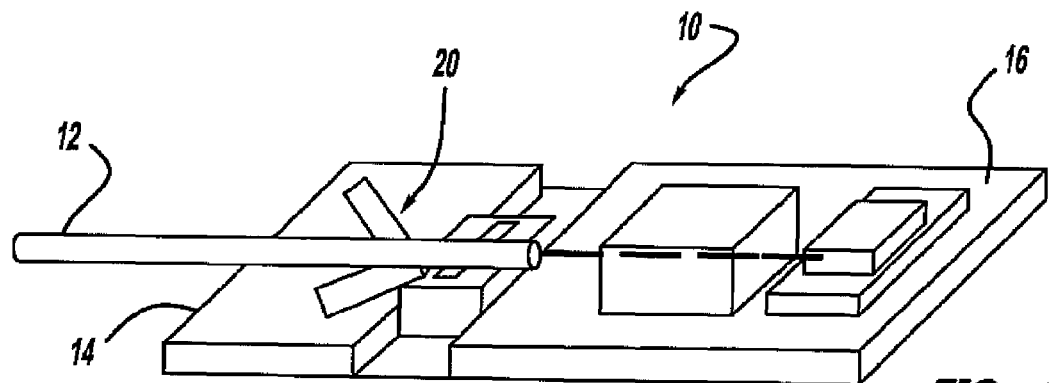
FIG. 1 is a perspective view of a piezoelectronic ultrasonic motor for an optoelectronic device.

The piezoelectric motor has a variety of uses. An example of a use in optoelectronics is optical fiber alignment in an optical device or nanopositioning, as shown in FIG. 1 at 10. The optical device includes an optical fiber 12, a base 14, an optical device 16, and a piezoelectronic ultrasonic motor 20. The motor also includes a rectangular metal plate or slider operatively connected to the stator. If an alternating current electrical field is applied a shear mode vibration will be excited. A shear mode vibration coupled with an orthogonal mode results in a linear motion in the longitudinal direction by the resulting elliptical motion at a motor tip produced by the piezoelectric ceramics.

Figure 2:
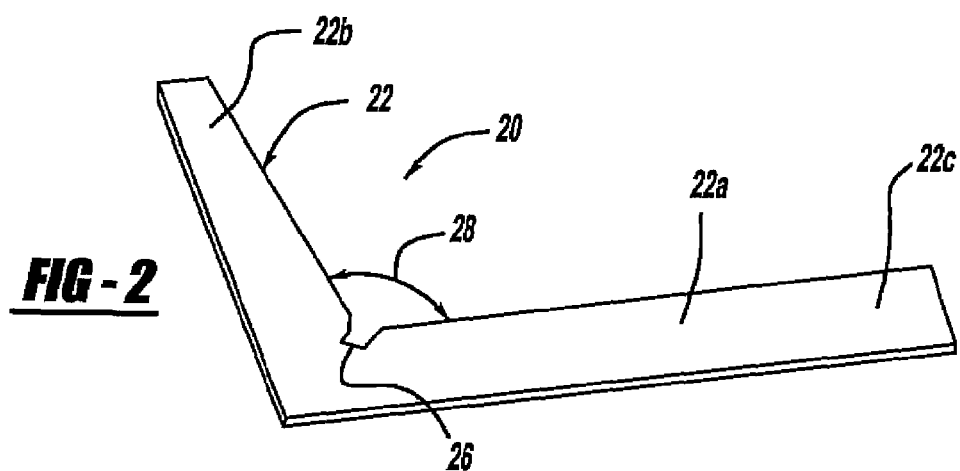
FIG. 2 is a perspective view of an L-shaped piezoelectric ultrasonic stator, according to the present invention.
Figure 3A:
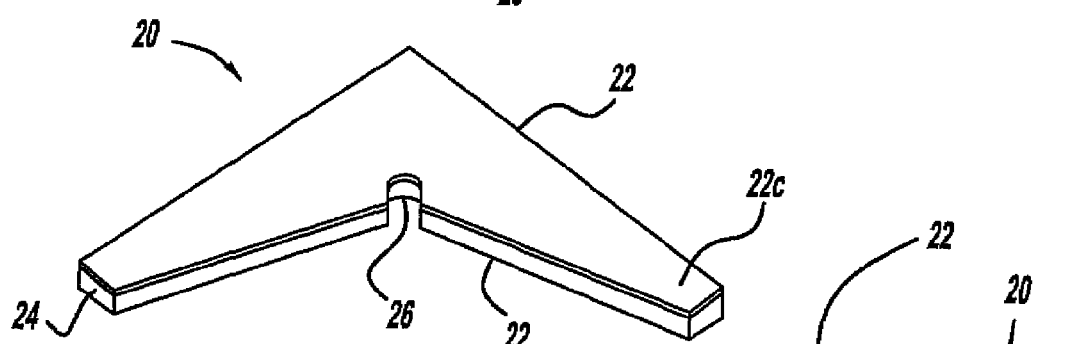
FIGS. 3*a*-3*f* are plan views of various wing shapes for the L-shaped stator of FIG. 2, according to the present invention.
Figure 3B:
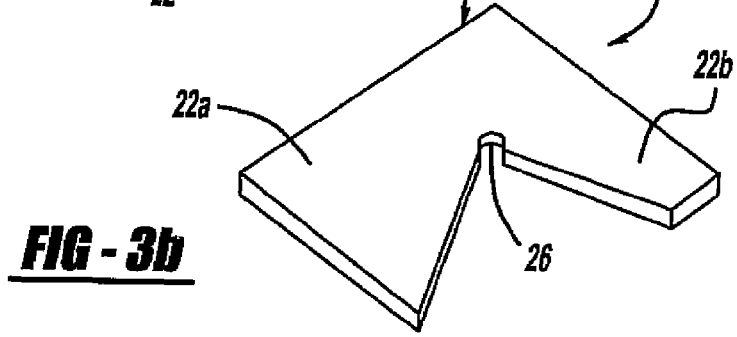
Figure 3C:
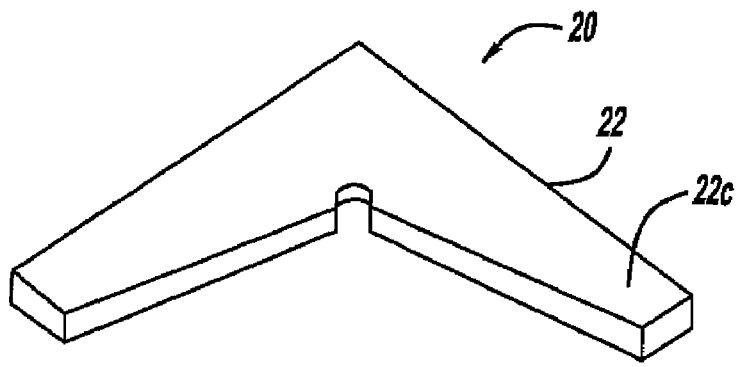
Figure 3D:
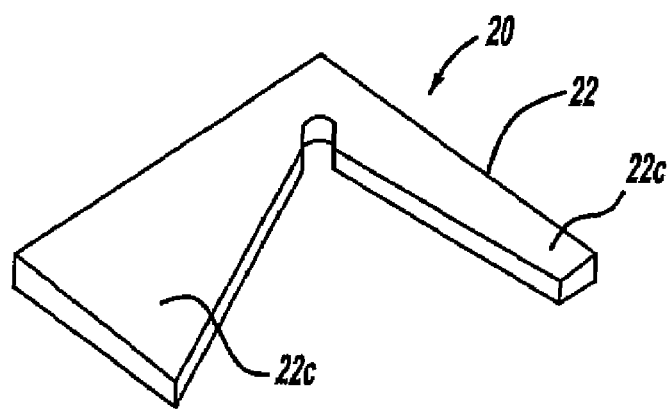
Figure 3E:
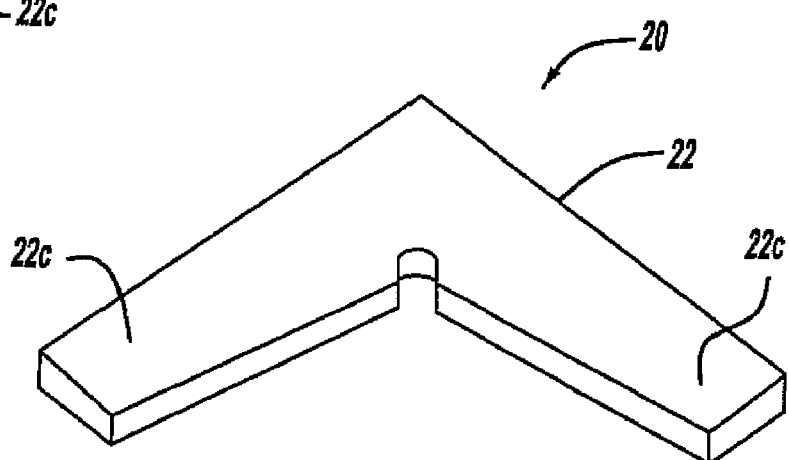
Figure 3F:
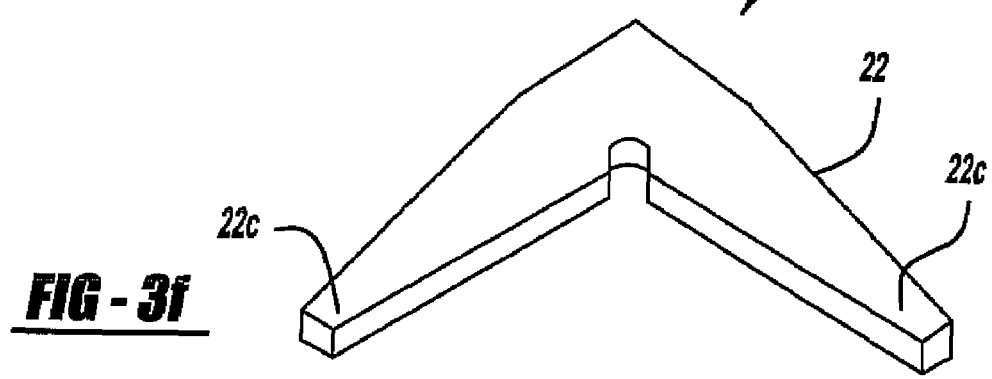

Referring to FIGS. 2-4, an example of an asymmetric L-shaped piezoelectric ultrasonic motor 20 for two-dimensional motion is illustrated. The L-shaped piezoelectric motor 20 includes a stator formed by two cojoined rectangular piezoelectric bars 22 or wings that have an electrode 24 positioned thereon. In particular, the L-shaped piezoelectric ultrasonic motor 20 includes two rectangular wings of piezoelectric material, and the wings are joined at a predetermined angle as shown at 28, to form the L shape. In this example, the L-shaped piezoelectric ultrasonic motor 20 includes two generally rectangular wings 22 of piezoelectric material 22 joined at a 90° angle to form the L shape. It should be appreciated that by changing the width of the wings 22 and angle between the wings 22, the frequency of the resonance modes may be changed, as shown in FIG. 3 and FIG. 4. For an asymmetric motor, the larger wing may be referred to as a master wing 22a, and the smaller wing a slave wing 22b.

The asymmetric L-shaped linear piezoelectric ultrasonic motor 20 preferably utilizes a combination of two displacement modes on each wing 22. For example, a maximum displacement can be obtained where a gap between two modes is a minimum. The excitation of each of the wings 22 produces a combined motion that is elliptical, and a circular motion at the junction of the wings 20 or the tips of the wings 22. This motion translates into a linear motion of a load by friction at a tip of the wing. For an asymmetric motor, the resulting combined motion of two different lengths of excited piezoelectric material leads to elliptical and circular motion at the junction or at the tip 22c. The design characteristics for the motor 20, such as frequency, motion shape and direction, displacement and driving voltage, number of driving inputs or output force, or the like, are generally dependent on the motor's master and slave wing dimensions, as shown in FIGS. 3 and 4 at 50.

In an example, a large elliptical displacement at the motor's tip and a small bandwidth between resonant frequencies, may achieved using PZT 8H materials. Another example of another ceramics material developed and used for motor fabrication is a $0.8Pb(Zr_dTi_{1-d})\text{-}0.2Pb[(1\text{-}c)\{(1\text{-}b)(Zn_{0.8}Ni_{0.2})_{1/3}(Nb_{1-a}Sb_a)_{2/3}\text{-}b(Li_{1/4}(Nb_{1-a}Sb_a)_{3/4})\}\text{-}c(Mn_{1/3}(Nb_{1-a}Sb_a)_{2/3})]O_3$, where a ranges between 0~0.3; b ranges between 0~0.4; c ranges between 0~0.4; d ranges between 0.46~0.5.

In this example, motor 20 elicits a 4.2 to 4.8 KHz bandwidth between modes. It should be appreciated that this result may be obtained using a computer aided engineering analysis methodology, such as Atila FEM software. For example, the motor displays an elliptical motion with an axial ratio (AR) of 8/7, to move a 2.6 gram load at a 9 mm/s being driven at 60 Vpp single phase, as shown in Equation 1:

$$V_{in1} = V_o \sin(wt) \qquad \text{Eq. 1}$$

In another example, the motor 20 is driven in a two-phase manner to obtain a further improvement in motion shape, displacement and stability, as shown in Equation 2:

$$V_{in1} = V_o \sin(wt) \ \& \ V_{in2} = V_o \cos(wt) \qquad \text{Eq. 2}$$

Where:
$V_o$=Original peak voltage (volts)
w=Frequency (radians/second)
t=Time (seconds)

The force driving the load at the tip of the wing 22c is identified as the frictional force defined by:

$$F_k = \text{mu} \ F_n \qquad \text{Eq. 3}$$

Where:
$F_k$=Kinetic force (Newtons)
mu=Coefficient of sliding friction
$F_n$=Normal force (Newtons)

In still another example, the L-shaped motor includes a groove cut 26 in a wing position opposite the motor's tip 22c, to increase the total displacement of the tip 22c. In yet a further example, a bimorph type "L" shape linear motor is obtained with a larger two-dimensional displacement by sandwiching two "L" shape motors with opposite polarization between the plates, as shown in FIG. 3. The two-dimensional displacement occurs by driving the bimorph motor 20 at different phase shifts by the power input, in a manner to be described.

Referring to FIGS. 5-11, another example of a symmetric piezoelectric ultrasonic stator for the motor is illustrated. The motor 30 has a single layer, symmetric, lambda (Λ) shape. The Λ-shaped motor 30 includes two piezoelectric rectangular bars or wings 32 joined at a predetermined angle 34. In this example the predetermined angle is 80 degrees. For the symmetric Λ-shaped motor 30, each bar has the same wing size, and the motor is driven by double phases in a manner to be described. The Λ-shaped motor 30 is similar in structure to the L-shaped motor 20.

As previously described with respect to the L-shaped motor, the resulting combined motion of the two vibrating piezoelectric wings 32 leads to elliptical and circular motions at the tip of each bar 38. These motions translate into linear motion of a load by friction between the tip 38 and a load. By changing the width of the bars and angle between the bars, the frequencies of the resonance modes may be modified, and the maximum displacement is obtained when a cap between the two modes is a minimum. The symmetric motor may advantageously have more stable clockwise and counterclockwise motion as compared to an asymmetrically shaped motor under certain conditions.

In order to drive the Λ-shaped motor 30, two driving sources with a 90° phase difference are applied:

$$V_{in1} = V_o \sin(\omega t) \quad (1)$$

$$V_{in2} = V_o \cos(\omega t), \quad (2)$$

where $V_o$ is original peak voltage (Volts), ω is frequency (radians/second) and t is time (seconds). Two resonance modes can be generated as shown in FIG. 10 at 50. One resonance mode produces a vibrational motion along the normal direction to a driving surface as shown at 52 and the other creates parallel motion to the surface motion as shown at 54. An elliptical displacement at the motor tip 38 is obtained by superimposing the two modes at a frequency between the resonance frequencies as shown at 56. Similarly, clockwise and counterclockwise motion can be obtained by applying inverse input signals.

The frictional force which drives the load at the tip of the motor may be described by:

$$F_k = \mu F_n \quad (3)$$

where $F_k$ is kinetic force (N), μ is friction coefficient and $F_n$ is normal force (N).

Figure 5:
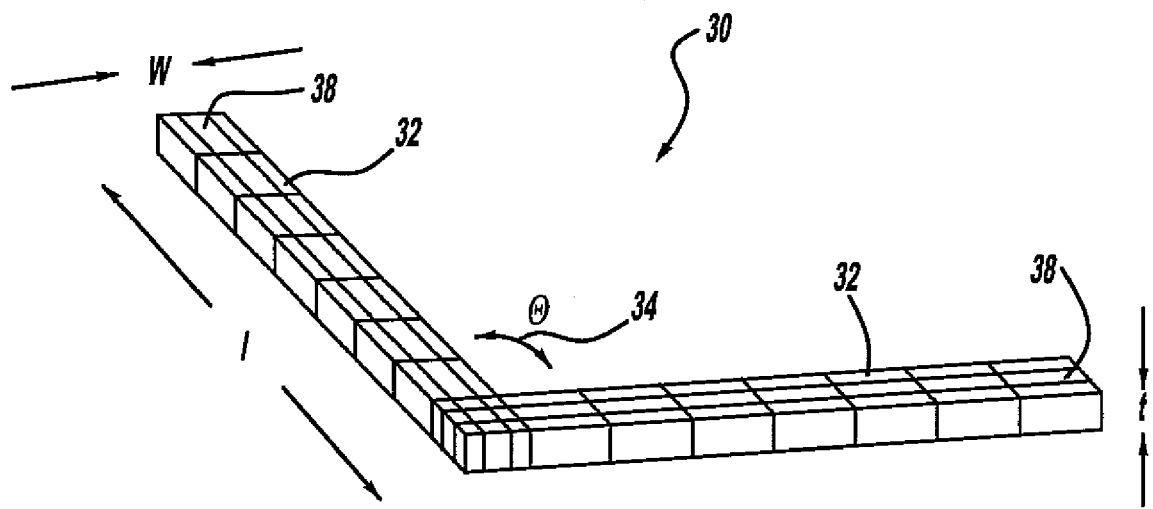
FIG. 5 is a perspective view of a symmetric Λ-shaped stator for a piezoelectric motor, according to the present invention.
Figure 6:
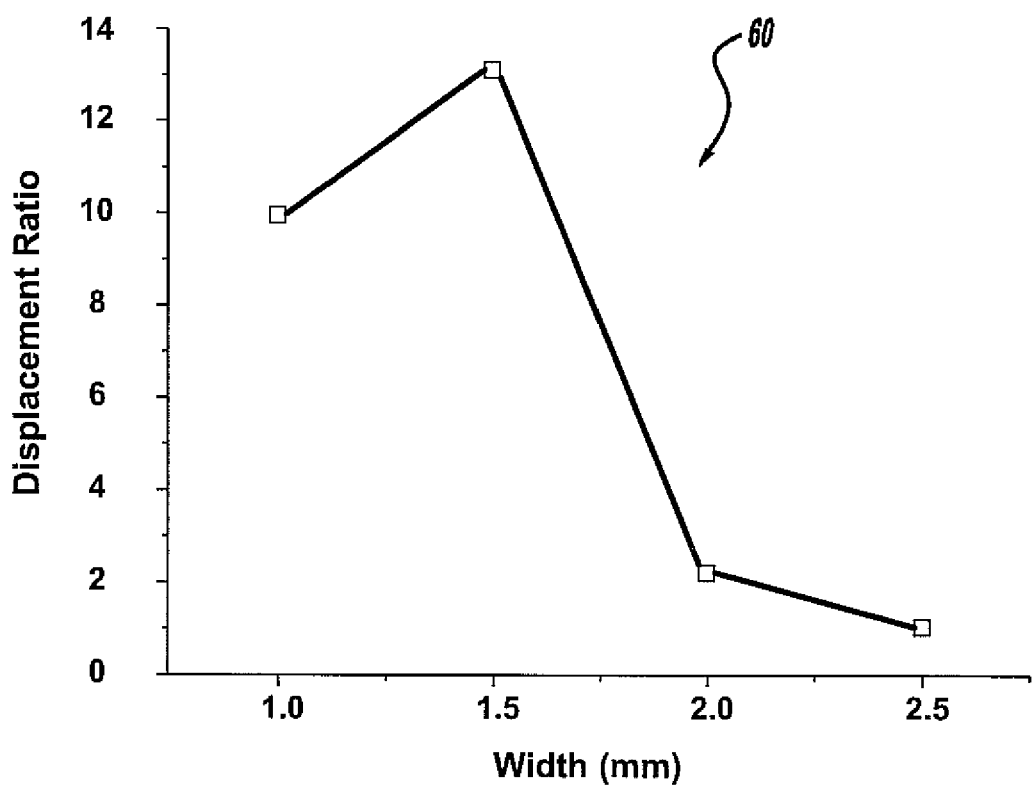
FIG. 6 is a graph illustrating the displacement ratio of the Λ-shaped motor with various widths, according to the present invention.
Figure 7A:
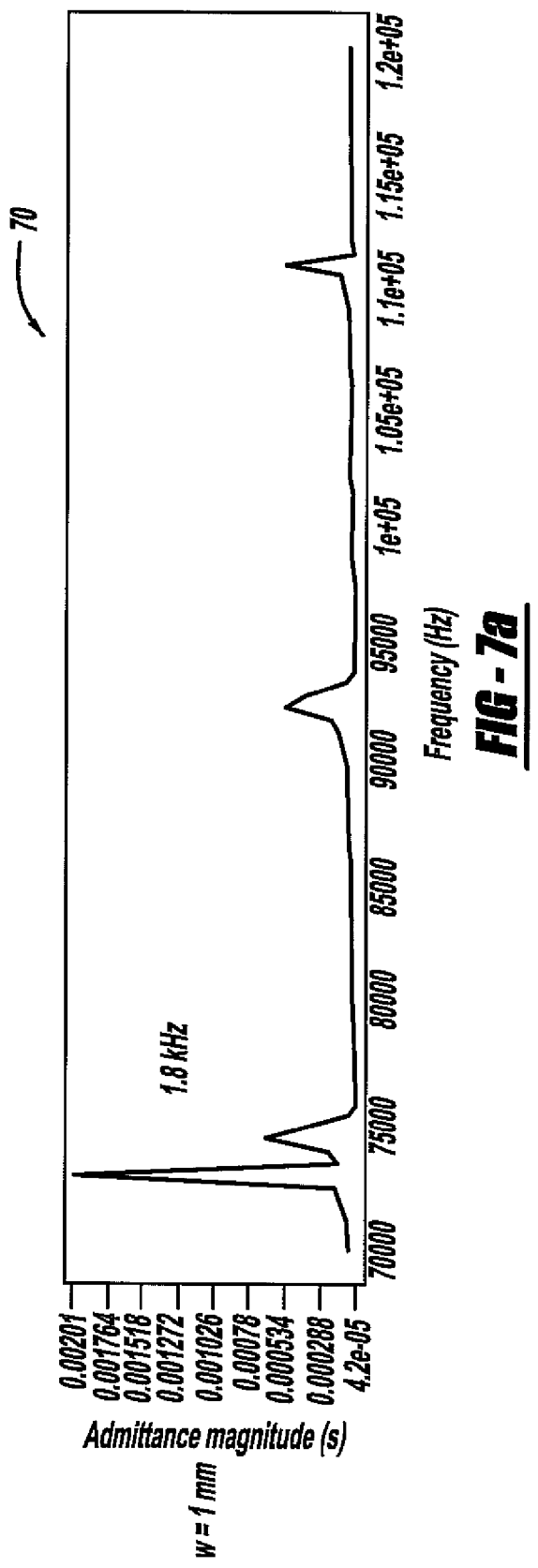
FIGS. 7*a* and 7*b* are graphs illustrating the effect of varying the width of the Λ-shaped piezoelectric motor of FIG. 5, according to the present invention.
Figure 7B:
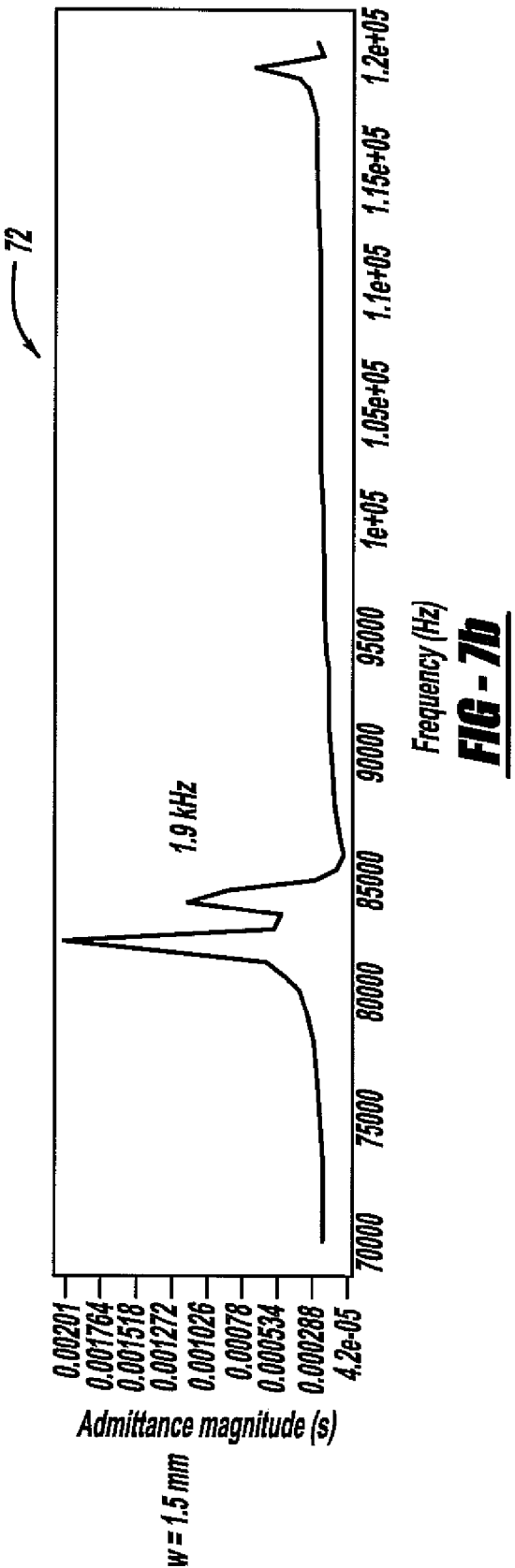
Figure 8A:
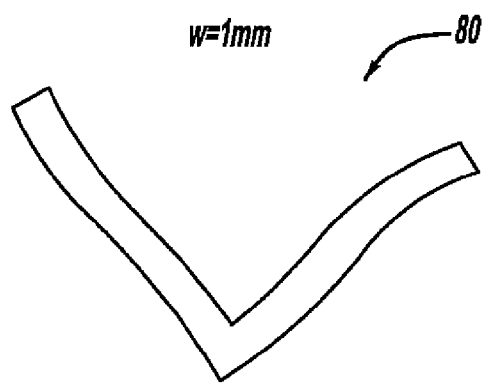
FIGS. 8*a*-8*d* are graphs illustrating displacement measurement of the symmetric Λ-shaped linear piezoelectric motor of FIG. 5 for selected widths, according to the present invention.
Figure 8B:
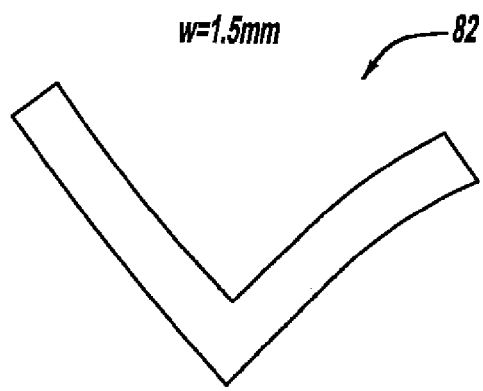
Figure 8C:
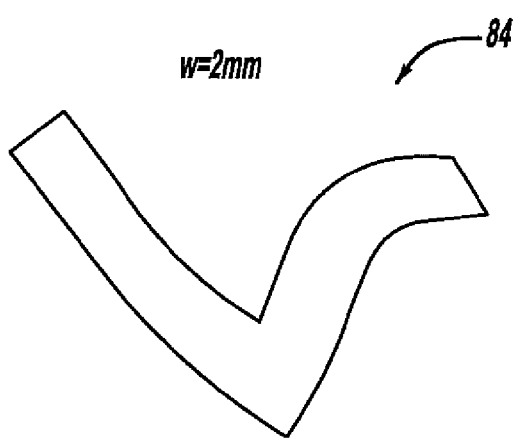
Figure 8D:
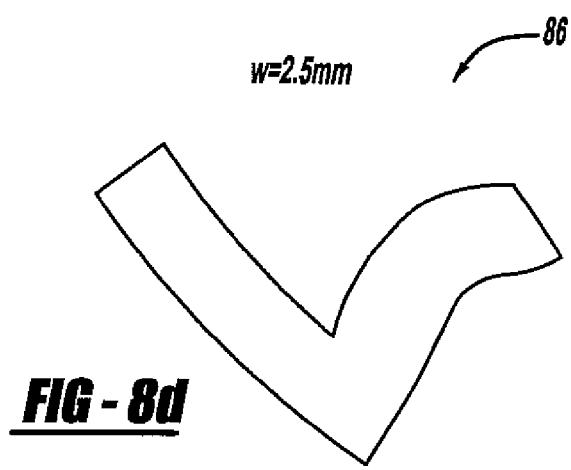

Referring to FIG. 5, a Λ-shaped motor 30 having a predetermined width (w), thickness (t), angle (θ) and length of the legs (l) is illustrated. In this example, the predetermined length is 10 mm, and thickness and driving voltage are 0.5 mm and 1 V, respectively. By changing the width (w) and angle (θ), the frequency of the resonance mode can be changed. As shown in FIG. 10, the elliptical motion at the motor tip is induced through by superimposing two resonance vibration modes. Therefore, the maximum elliptical displacement can be obtained when the gap between two resonance frequencies is minimized. FIG. 6 illustrates the relation between the width of stator and the displacement of the motor at the tip for constant width length and angle (90°) as shown at 60. FIG. 7 illustrates the effect of changing the width on frequency at 70. FIGS. 8*a*-*d* illustrate the effect of changing the width on displacement at 80, 82, 84 and 86 respectively. In this example, a width of 1.5 mm demonstrated a maximum displacement at the tip 38 that was approximately 13 times higher displacement than a similar structure with a width of 2.5 mm.

Figure 9A:
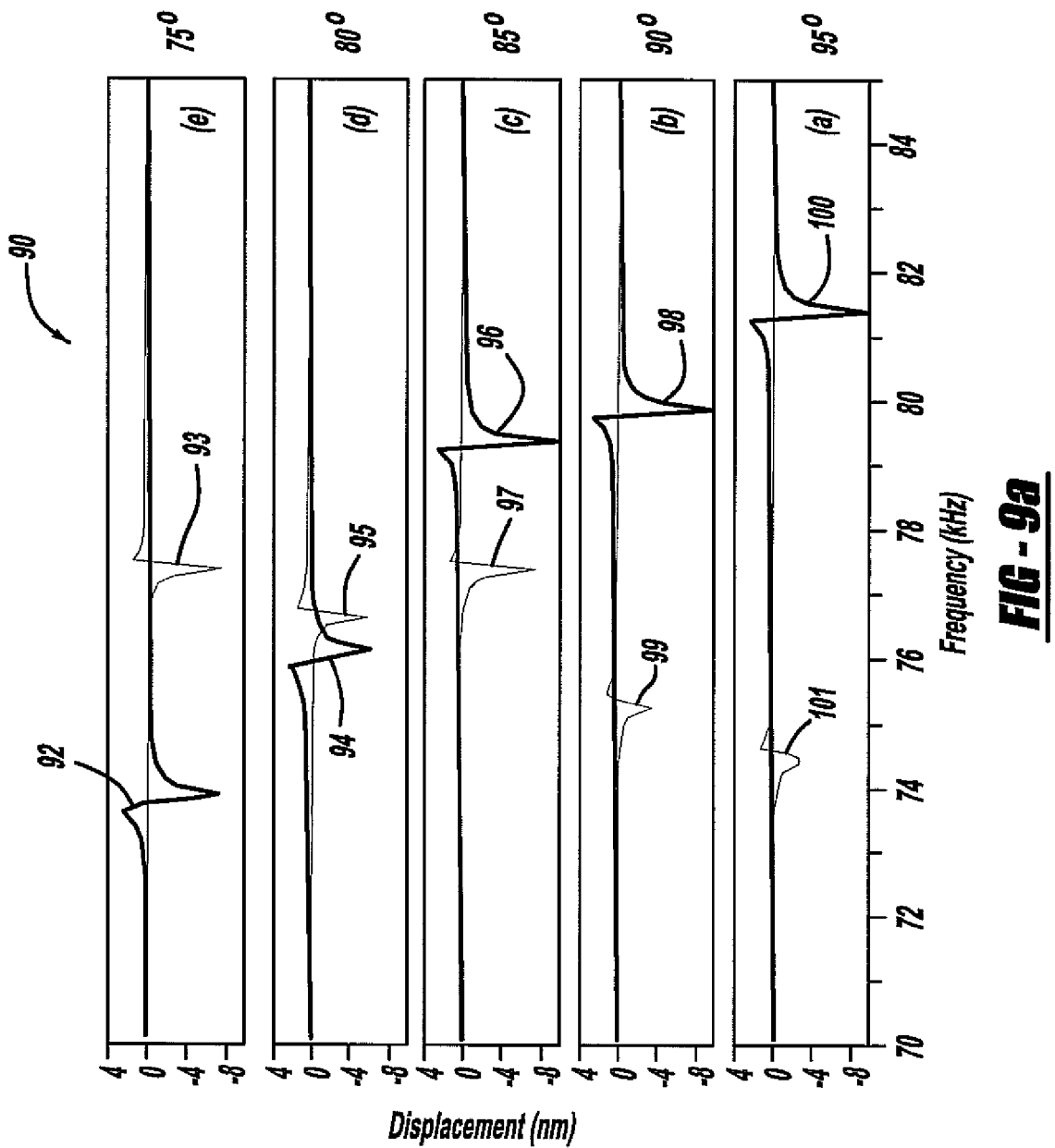
FIG. 9 is a graph illustrating the effect of varying the angle of the Λ-shaped piezoelectric motor of FIG. 5, according to the present invention.

In addition to a change in width (w), a magnitude of the relative resonance frequency can be varied through different angles (θ). Referring to FIG. 9, a resonance peak in the range of 70 to 86 kHz is obtainable for angles of 95°, 90°, 85°, 80° and 75° respectively, as shown at 90. The displacement along the x-axis is illustrated at 92, 94, 96, 98 and 100 and the displacement along the y-axis is illustrated at 93, 95, 97, 99 and 101. These two motions correspond to the two resonance modes which were shown in FIG. 10. It should be appreciated that by changing θ, a resonance mode that provides x-axis directional bending is shifted to the higher frequency range, while the y-axis directional bending mode is moved down to lower frequency region. As shown in FIG. 9*a*, these two modes came closest to each other when θ=80°. At this angle, the maximum elliptical displacement at the motor tip was obtained. It should be appreciated that in this example, modification of the angle resulted in maximum elliptical displacement. Therefore, an optimized angle is obtained when a gap between the up-down and forward-backward motions is at a minimum, to enhance the displacement and torque of the motor. By changing the angle, the gap is controllable.

In this example, various modes of the motor tip were simulated using the previously described ATILA FEM software. Variations in the angle modified the gap between up-down and forward-backward resonance modes. In this example, at an 80° angle, the gap between two modes was minimized and displacement for the motor tip was maximized, as shown in FIG. 9*a* at 94 and 95. Clockwise and counterclockwise motion may be obtained by changing input driving phase. Up-down, forward-backward and elliptical motions may be observed, such as by using a laser interferometer.

Figure 11:
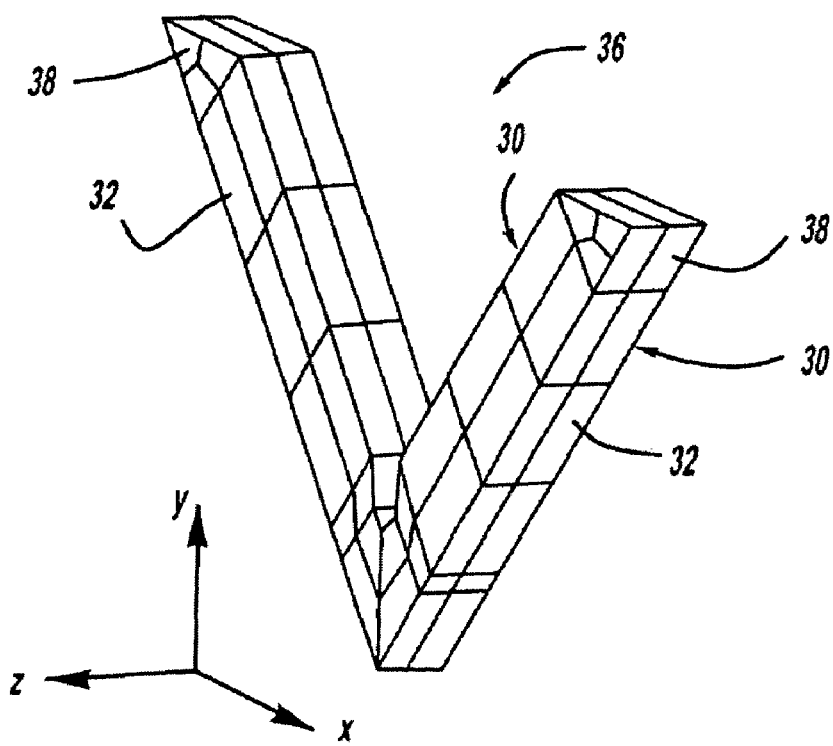
FIG. 11*a* is a perspective view of a 2-dimensional sandwiched Λ-shaped motor, according to the present invention.
Figure 12:
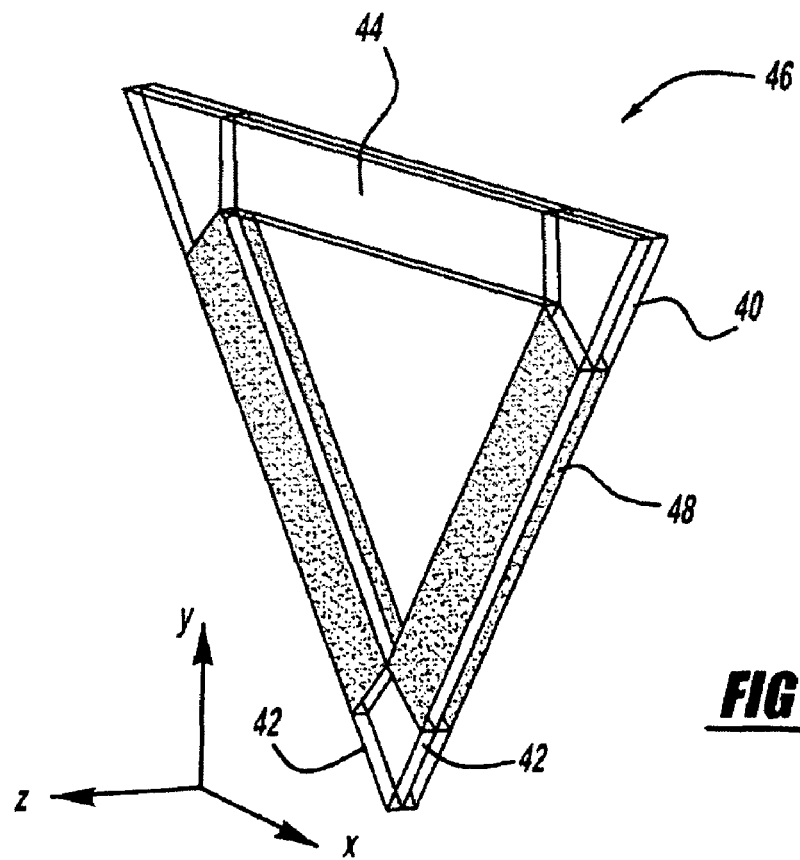
FIG. 12 is a perspective view of a bimorph Δ-shaped piezoelectric motor, according to the present invention.
Figure 13A:
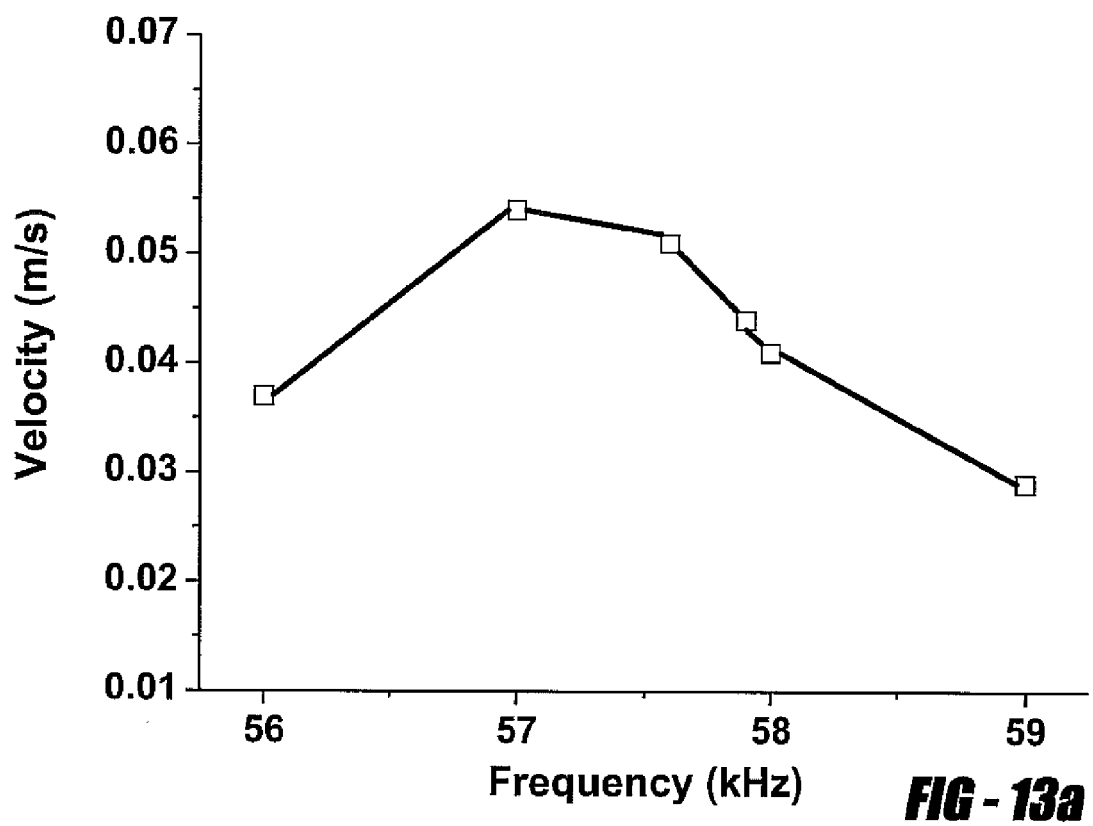
FIGS. 13a-13c are views illustrating the velocity of the sandwiched Δ-shaped linear piezoelectric motor of FIG. 12, according to the present invention.
Figure 13B:
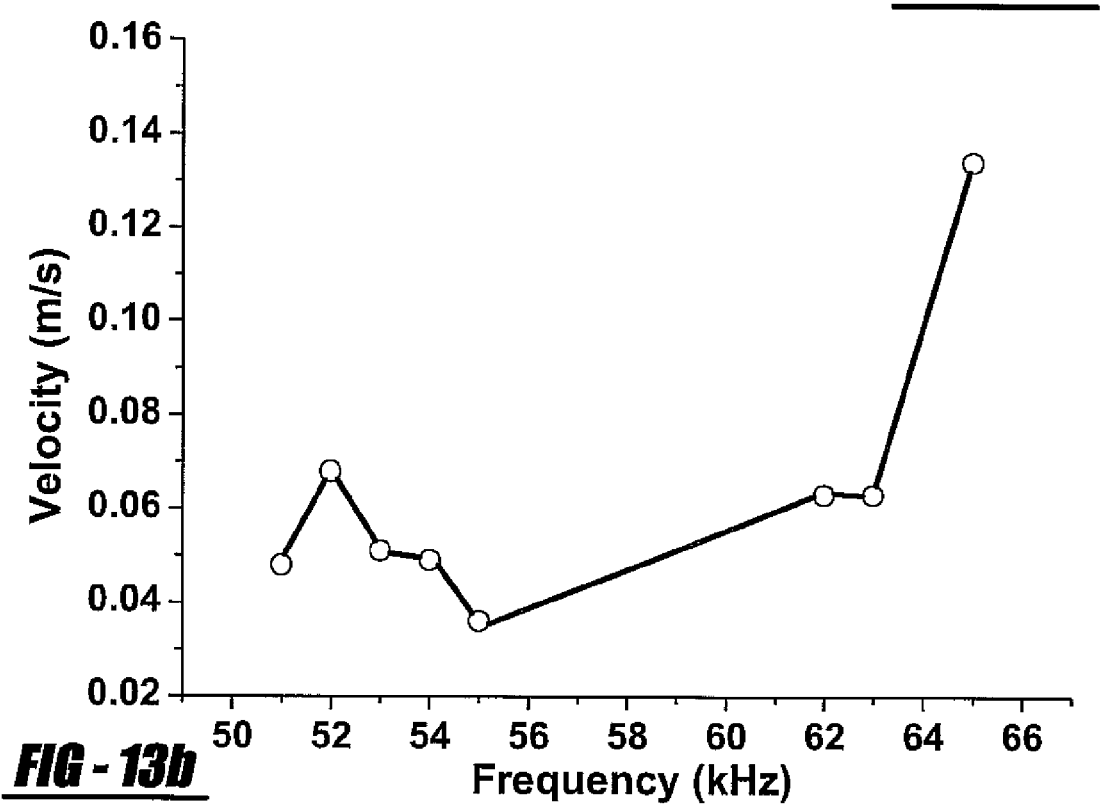
Figure 13C:
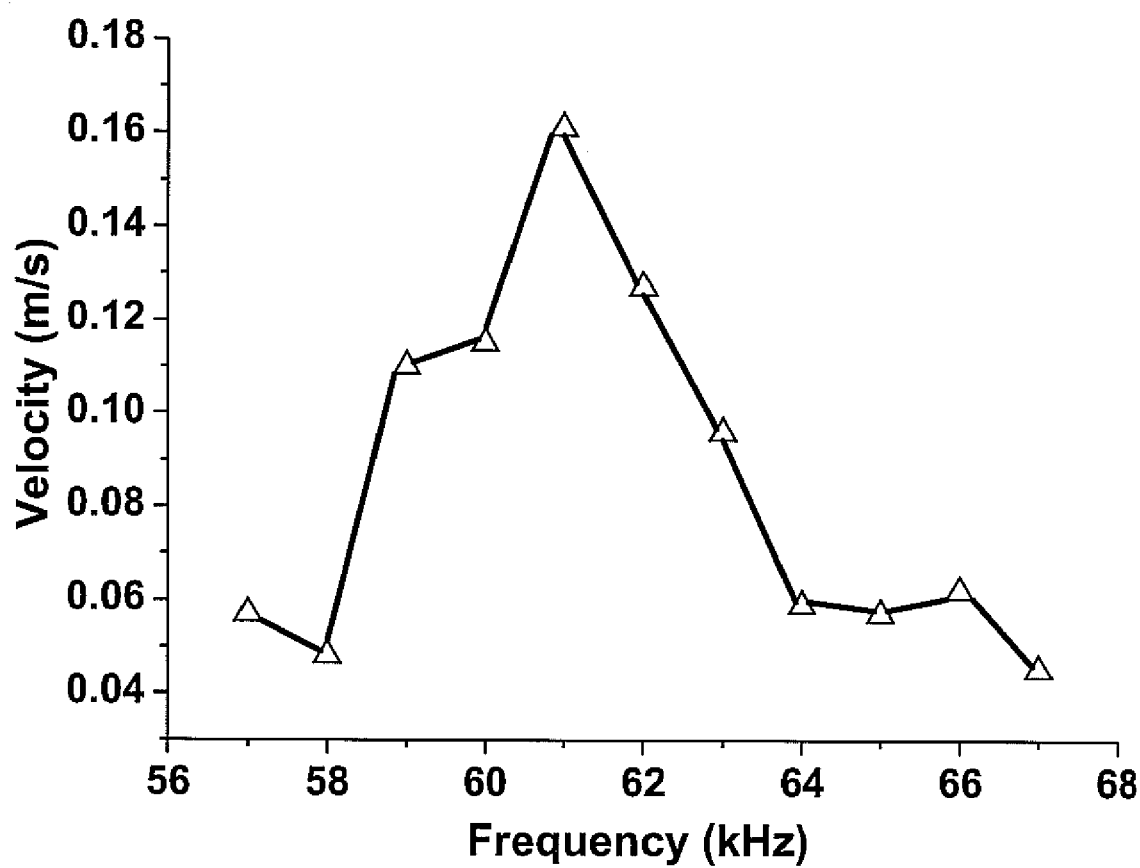

In another example of a sandwiched or bimorph type Λ-shaped symmetric motor, 2-dimensional displacement is obtained by stacking two Λ-shaped motors with opposite polarization directions, as shown in FIG. 11 at 36. The sandwiched Λ-shaped motor has increased degrees of freedom. The 2-dimensional displacement is achieved by driving the motor at a different phase shift at the power input. By controlling each input phase, the motor can move along the x and y directions as well as the diagonal direction. Double phases (sine and cosine voltages) can be used for the x, y and diagonal axis movement in this example.

Referring to FIGS. 12-19, a further example of a piezoelectric ultrasonic motor having a delta (Δ) shape 40 is illustrated. The Δ-shaped motor 40 includes two piezoelectric bars or wings 42 joined at a predetermined angle, and a third bar 44 disposed between the free ends of the two bars 42. The third bar 44 is inactive. The Δ-shaped motor 40 advantageously enhances motor stability during cofiring process, and assists in processing reproducibility, as compared to other shaped motors. In addition, the Δ-shaped motor 40 advantageously improves wire connection and angle change after sintering process.

Figure 16:
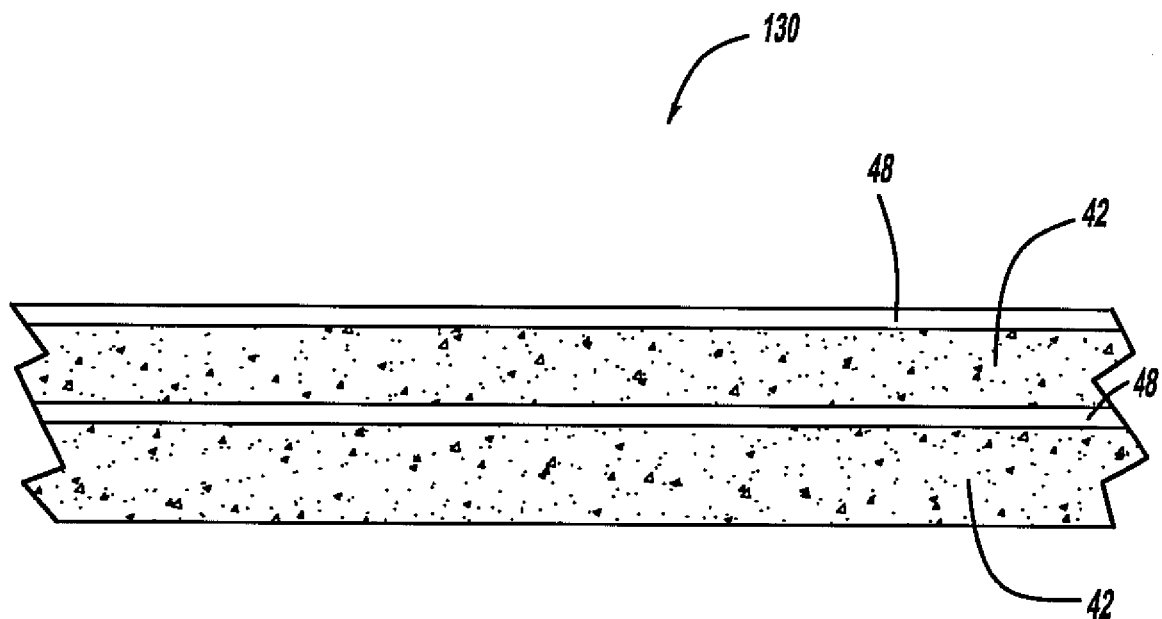
FIG. 16 is a sectional view of a bimorph Δ-shaped motor, according to the present invention.

In an example of a sandwiched Δ-shape symmetric motor 46, two Δ-shaped motors with opposite polarization directions are sandwiched between the plates. A cross-sectional view of the motor is illustrated in FIG. 16 at 130. The Δ-shaped motor includes four input electrodes and one ground electrode as shown at 48. An advantage of this bimorph structure is that two degrees of freedom is obtained for the motor under a drive condition. In addition, the inactive bar 44 provides a surface for locating a ground electrode, and also adds uniformity to the structure by balancing any shrinkage that may occur during the sintering process. In the Δ-shaped motor 40, double phases (cosine and sine) are used to obtain clockwise and counterclockwise motion, as well as x, y and z diagonal motion.

Figure 18A:
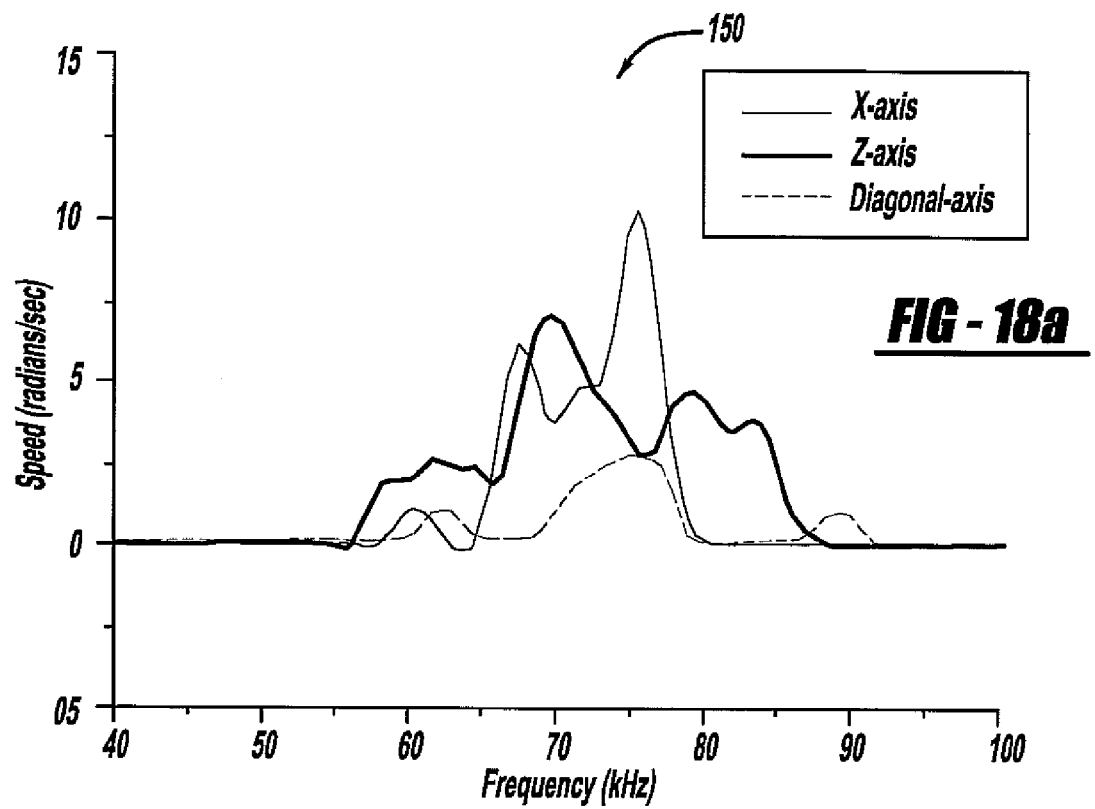
FIGS. 18a-18c are graphs illustrating the effect of frequency of (a) speed, (b) torque and (c) efficiency for the bimorph Δ-shaped motor, according to the present invention.
Figure 18B:
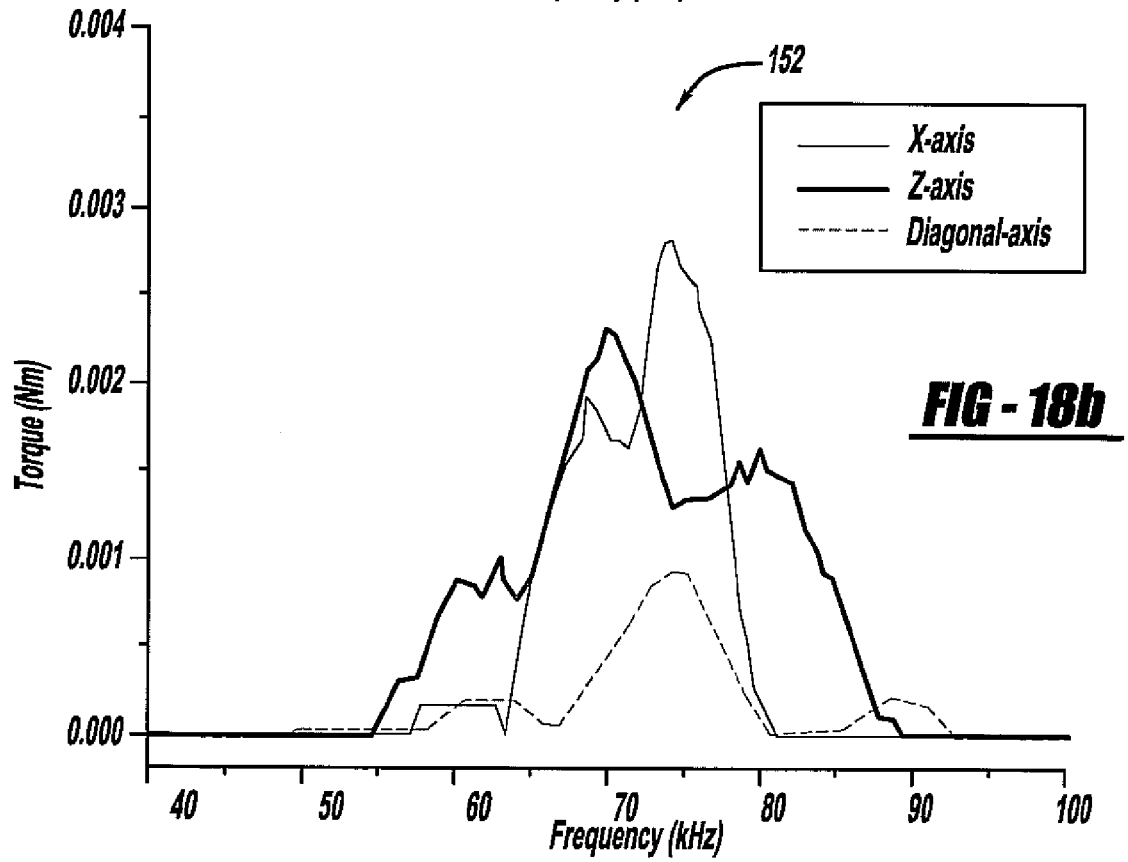
Figure 18C:
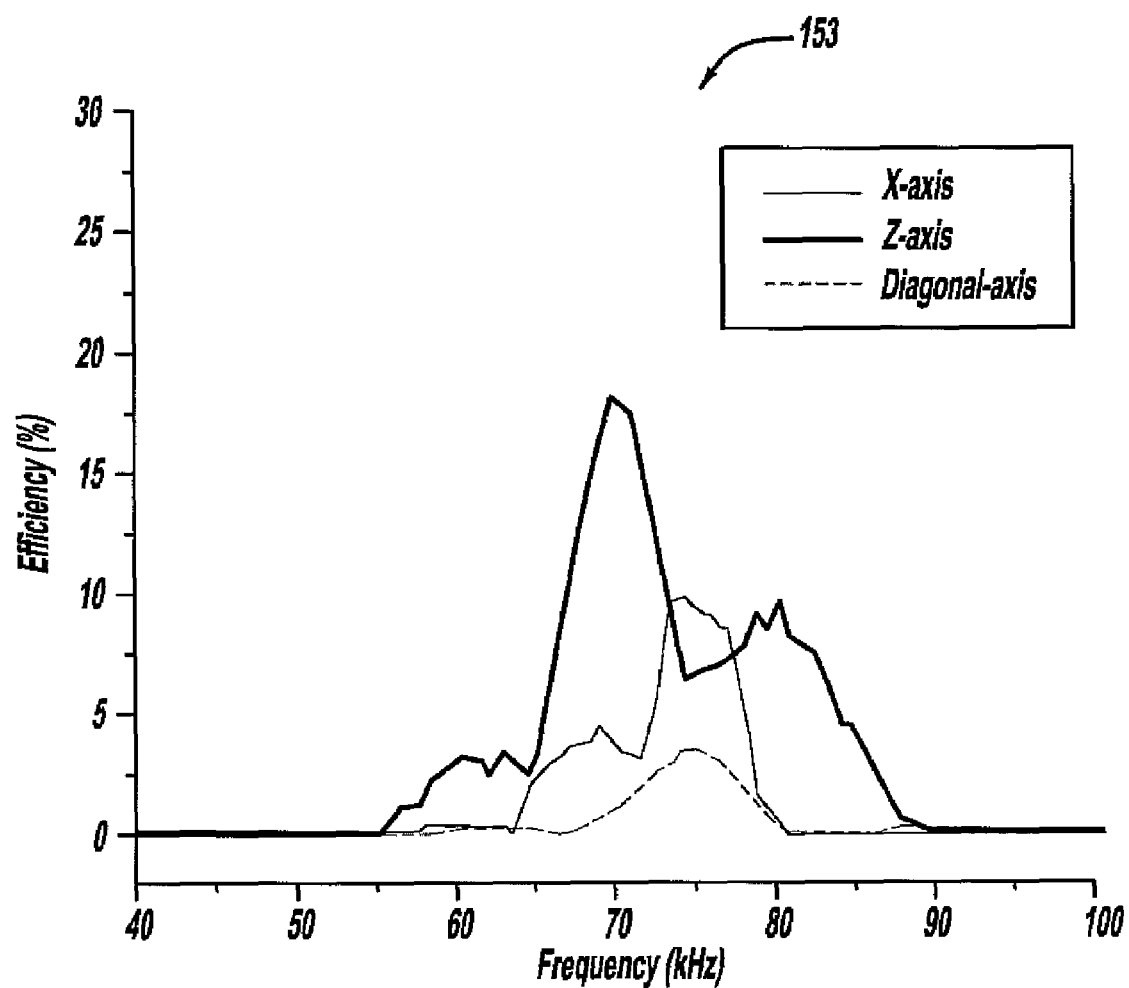

Referring to FIG. 19, a table demonstrating control of various motions of the bimorph Δ-shape motor in 2-dimensional space is illustrated at 110. Two signals with 90° phase difference were allocated to the four inputs of the motor to control 2-degrees of freedom motions. For example, when the z-axis is used as a polarization direction, 2-dimensional motion was observed in the x-z plane. The x-axis directional motion is the same as with the single layer case. For z-axis motion, the driving motion is the same as with the x-axis case. Two phases were applied into 1 and 2 electrodes and other two phases with 90° phase difference were given into 3 and 4 electrodes. It should be appreciated that diagonal motion of the Δ-shaped motor 40 may be used for positional accuracy by applying three signals with the same phase and one signal with a 90° phase difference. Vibration amplitude, frequency and load condition can be used to determine the speed of the motor, since driving force is dependent on the friction between the contact point of stator and slider, as shown in FIGS. 18*a*-18*c* at 150, 152 and 154, respectively.

Figure 14A:
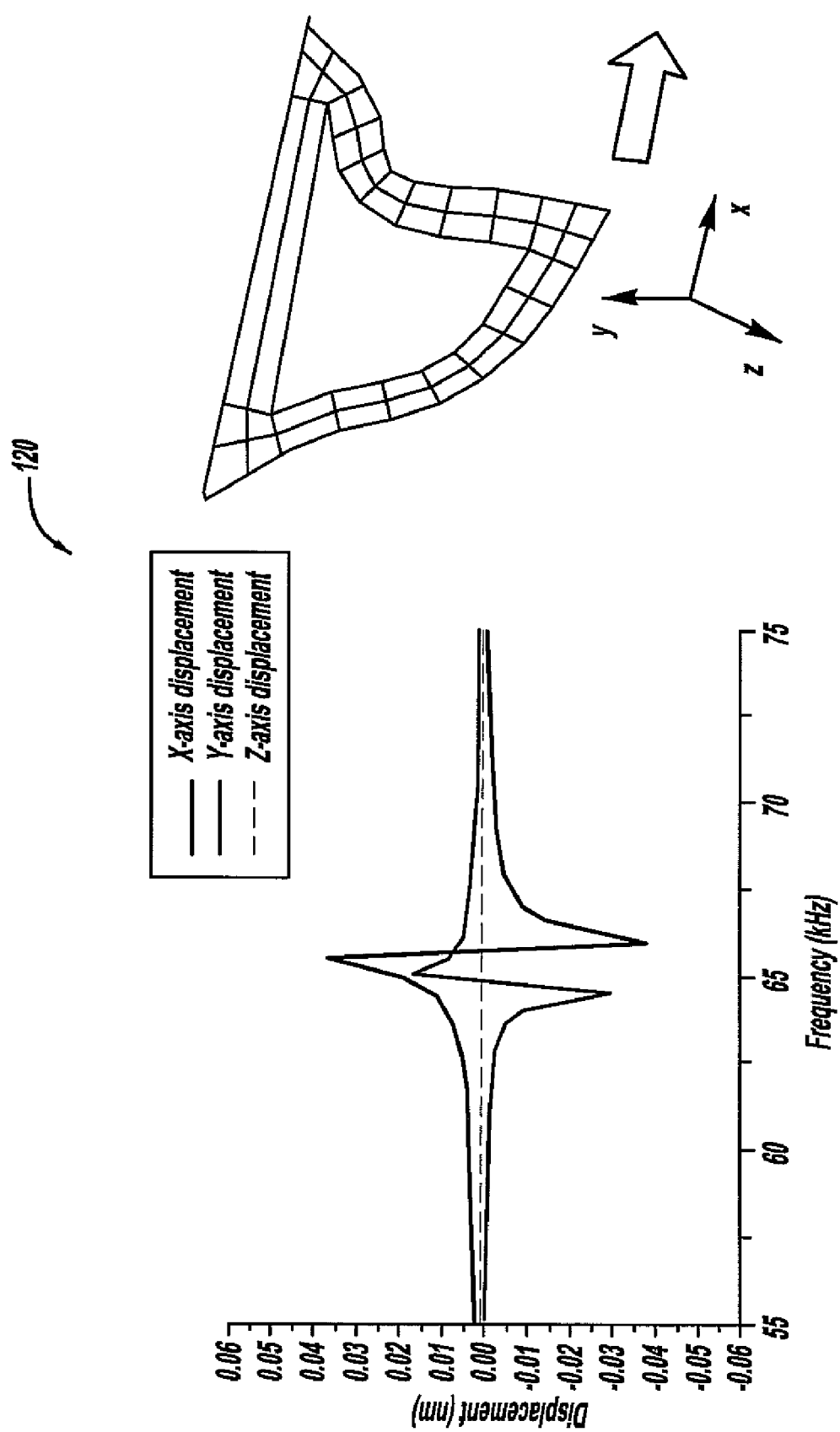
Figure 14C:
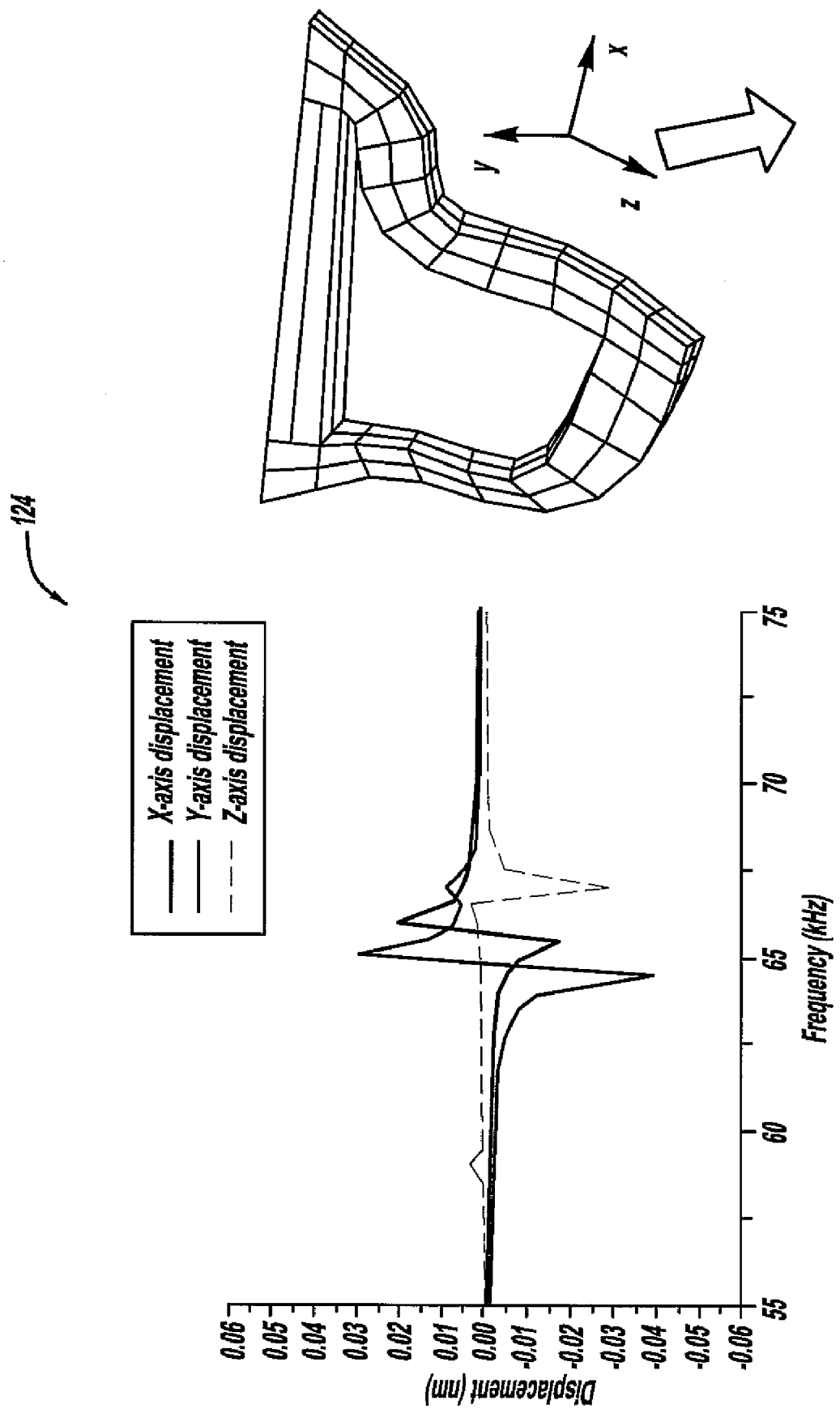

Referring to FIGS. 14*a-c*, various modes of the motor tip may be simulated as previously described using a simulation technique, such as the previously described ATILA simulation. In this example, total thickness of the motor is 0.5 mm (0.25 mm for each layer) and other parameters were the same as in the Λ-shape motor case. At an angle of 80°, all of the x, z and diagonal-axis directional motions were observed at 65 kHz. It should be appreciated that the observed resonance frequency difference between Λ and Δ motors may be due to the additional inactive bar and common ground electrode between two Λ motors.

Figure 17A:
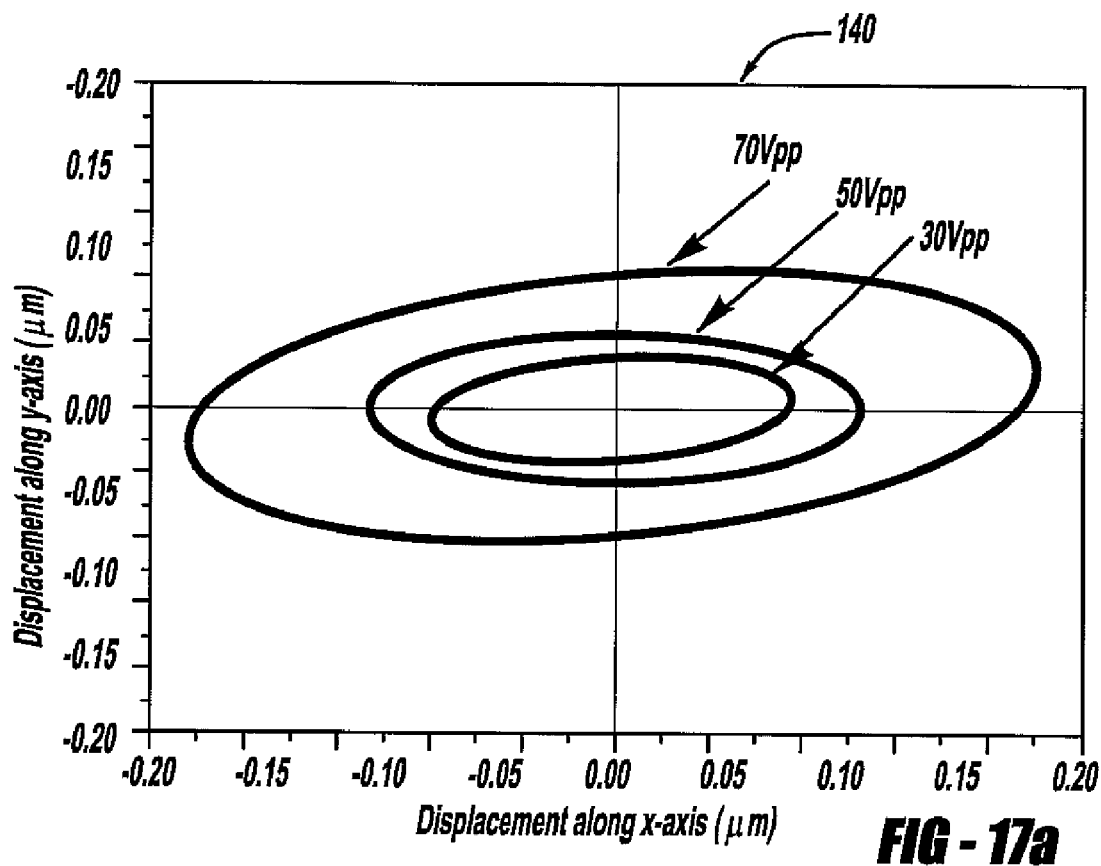
FIGS. 17a and 17b are graphs illustrating displacement at the motor tip as measured by a laser interferometer in the (a) x-axis and (b) z-axis directional movement for the Δ-shaped motor, according to the present invention.
Figure 17B:
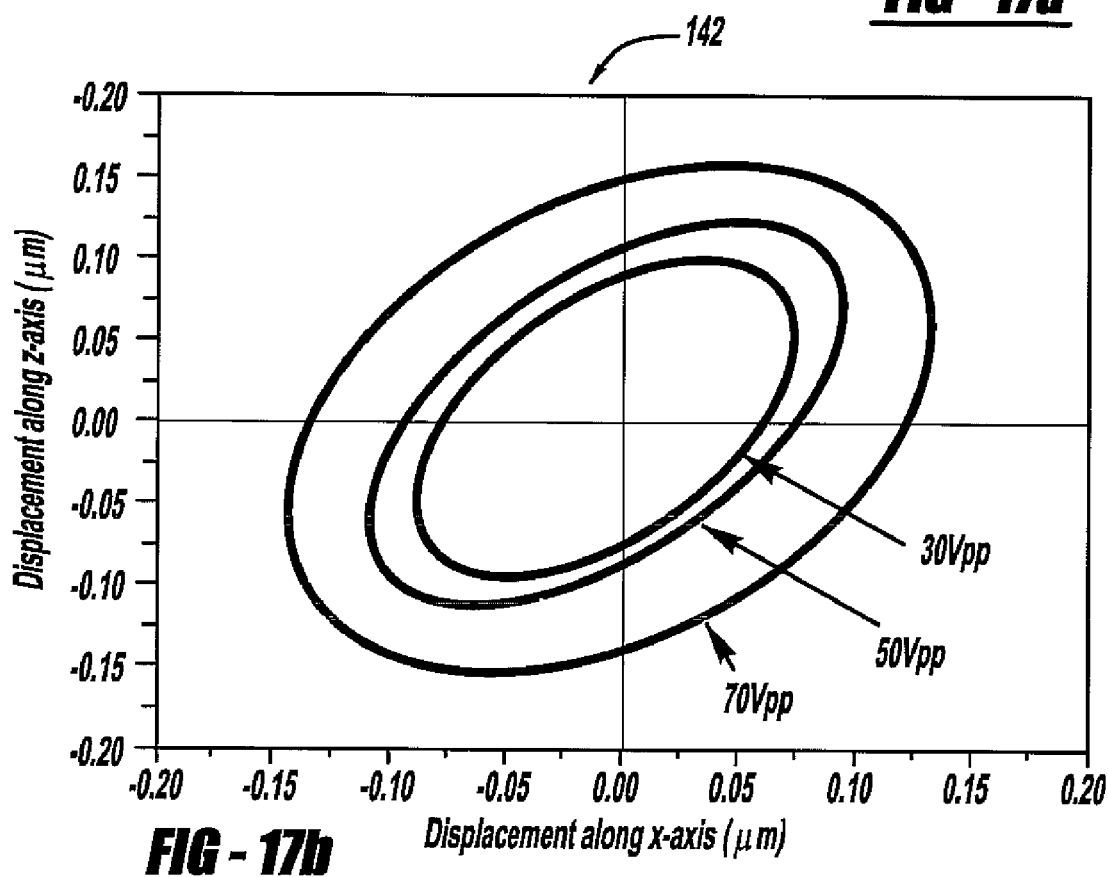

As shown in FIGS. 17*a*-17*b*, the displacements at the motor tip as measured by a laser interferometer for x vs. y at 140 and x vs. z axis at 142 with various driving voltages. In this example, several tens of nanometer displacements with elliptical motions were measured both in x and z axis. At 78 kHz, both x and z directional motion was obtained simultaneously, by utilizing a single frequency driving for the two motions. To obtain a predetermined displacement, the applied voltage may be changed and enlargement of elliptical motion may be obtained. Speed of the motor may be calculated using driving frequency and displacement at the motor tip. For example, when the motor rotates a 19 mm diameter bearing under 70 $V_{pp}$ driving voltage condition, 7.4 radians/sec and 2.5 radians/sec may be obtained for x and z directional motions, respectively.

Any of the motors 20, 30, 40 may be fabricated by various processes, such as a "cut and bond" technique or a cofiring technique. Further, in this example the ground electrode can be soldered. Low temperature cofired ceramic (LTCC) technology may be used to make a sandwiched structure that includes the internal electrode. For example, a silver electrode may be cofired with top and bottom motors at 900° C. The displacement of the motor tip in a 2-dimensional space may be measured by laser interferometer. For example, at 45.1 kHz a simple driving circuit having movements along both the x and y axis. Displacement of the tip can be obtained by changing applied voltage, as previously described. In this example, the velocity of the motor is measured in the x, y and diagonal directions.

Figure 20:
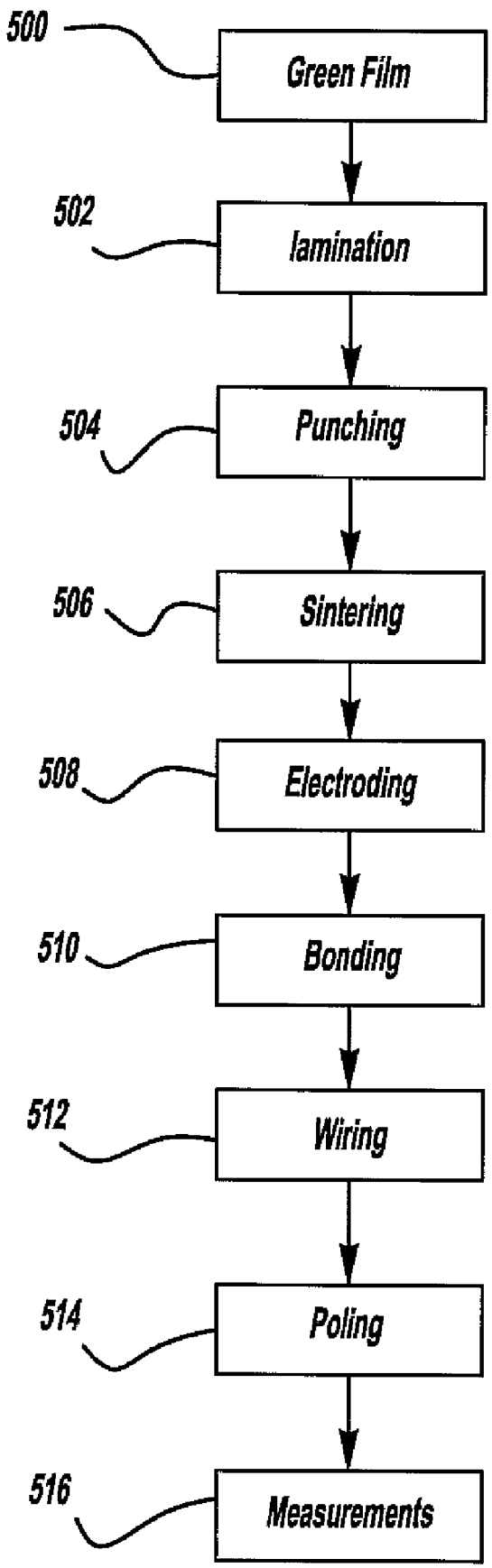
FIG. 20 is a flowchart illustrating a process for fabricating the motor, according to the present invention.

Referring to FIG. 20, an example of a fabrication process for a motor, such as the bimorph-structure Δ-shaped motor, is illustrated. The motor includes the step 500 of preparing the film. In this example the film is a lead zirconate titanate (PZT) based thick films, such as NCC-NA01 produced by Nihon Ceratec Co., Ltd., Japan. The process of fabricating the motor includes the step 502 of laminating the films, such as a PZT green film, to a predetermined thickness, such as 0.4 mm, using a thick film process. For a cofired structure, a common electrode ground may be printed between two ceramic layers and then laminated. The structure utilizes a high power applicable and low temperature sinterable ceramic, cofired with a silver electrode. In a next step 504, the film is punched into a predetermined shape, as previously described, for example r=0.3175 mm. A shrinkage factor maybe applied to account for material densification during firing. In a next process step 506, after binder removal, the motor is sintered. For example, the motor is sintered at 1100° C. for 2 hours. A paste, such as Ag—Pt paste by Dupont QS171, may be printed on the motor and the motor is post-fired at 850° C. for 15 minutes dwell time at peak temperature. The Δ-shaped motor advantageously avoids angle changes during the sintering process as compared to other motors. In a next process step 508, a poling process is performed in a silicone oil bath at 120° C. under 3 kV/mm for 30 minutes in the thickness direction. In the next process step 510, the bimorph structure motor is fabricated. For example, two motors were attached together with an epoxy, such as that produced by Emerson & Cuming under the name STYCAST 1266. In a next process step 512, copper wires are soldered to the electrodes, and the motor is installed on the motor holder using an instant epoxy, such as a cyanoacrylate instant adhesive, such as Loctite® or Quicktite®. In a further process step 516, measurements are made. For example, 2-dimensional displacement at the motor tip may be measured by a laser interferometer (OFV 511, Polytec). The speed of revolution, torque and efficiency may be measured and calculated as shown in FIG. 18*c* at 150, 152 and 154 for a bimorph Δ-shaped motor with a pre-load of 1.1 N. The spring length may be adjusted to apply a desired load condition. Transient speed and speed of revolution may be measured by an optical sensor which detected slits attached to a bearing. From these measurements torque and efficiency of the motor are determinable.

Figure 21:
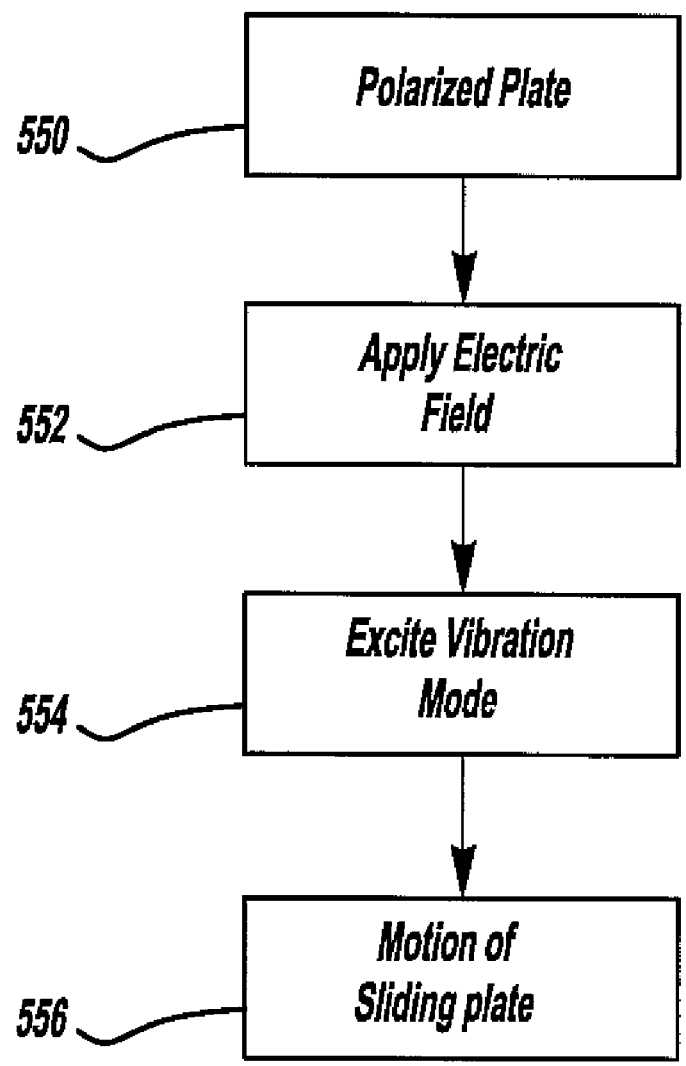
FIG. 21 is a flowchart illustrating a method of exciting a flexure elliptical motion at the motor tip to drive the motor in a linear direction, according to the present invention.

Referring to FIG. 21, a method of exciting a bending mode vibration in the piezoelectric ceramic plate for the linear ultrasonic motor, as previously described with respect to FIGS. 1-19. The method begins in block 550 with the step of polarizing the stator in a predetermined direction.

The method advances to step 552, and an electric field, such as a voltage, is applied to the electrode.

In block 554, a bending vibration motion is excited on the stator, as a result of the applied voltage. The method advances to block 556.

In block 558, a flexure vibration elliptical motion at the motor tip produced along the length direction of the bar or wing results in a deformation of the surface of the bar. The stator moves in a linear direction, resulting in the corresponding motion of the slider for the motor.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

The invention claimed is:

1. A piezoelectric ultrasonic motor having 2-dimensional positioning movement, the motor comprising:

a stator, wherein said stator includes a piezoelectric ceramic bar and an electrode disposed on the bar, and the bar includes two wings that are separated by a predetermined angle to form a predetermined shape, wherein a free end of each wing forms a tip and a groove is located at a junction between each wing to increase a total displacement of the tip of each wing;

a power input, wherein said power input applies a voltage to the stator to excite a vibration in the each of the wings, and the combined motion of each wing produces a 2 degrees of freedom elliptical motion at the tip of each wing; and a load operatively connected to the stator, wherein a portion of the load in contact with the stator is driven in an x, z or diagonal direction to move the load linearly in 2-dimensional space through a frictional force between the load and the stator, due to the elliptical motion at the tip of each wing.

2. The motor of claim 1, wherein the wings are joined at a 90 degree angle to form an asymmetric L shape.

3. The motor of claim 2, wherein the stator includes two bars having opposite polarization sandwiched together to form a bimorph L-shaped motor with 2-dimensional displacement, by controlling two driving signals shifts into four inputs having a predetermined phase shift difference.

4. The motor of claim 2, wherein a frequency of a resonance mode is determinable from a width of the bar and the angle between the wings.

5. The motor of claim 2, wherein the bar is made from a piezoelectric ceramic material $0.8Pb(Zr_dTi_{1-d})$-$0.2Pb[(1-c)\{(1-b)(Zn_{0.8}Ni_{0.2})_{1/3}(Nb_{1-a}Sb_a)_{2/3}$-$b(Li_{1/4}(Nb_{1-a}Sb_a)_{3/4})\}$-$c(Mn_{1/3}(Nb_{1-a}Sb_a)_{2/3})]O_3$, and a ranges from 0~0.3, b ranges from 0~0.4, c ranges from 0~0.4 and d ranges from 0.46~0.5.

6. A piezoelectric ultrasonic motor having 2-dimensional positioning movement, the motor comprising:
   a stator, wherein said stator includes a piezoelectric ceramic bar and an electrode disposed on the bar, and the bar includes two wings joined at a 90 degree angle to form an asymmetric L shape, wherein a free end of each wing forms a tip and a groove is located at a junction between each wing to increase a total displacement of the tip of each wing;
   a power input, wherein said power input applies a voltage to the stator to excite a bending mode vibration in the each of the wings, and the combined motion of each wing produces a 2-dimensional elliptical motion at the tip of each wing;
   a load operatively connected to the stator, wherein a portion of the load in contact with the stator is driven in an x, z or diagonal direction to move the load linearly in 2-dimensional space through a frictional force between the load and the stator, due to the elliptical motion at the tip of each wing.

7. The motor of claim 1, wherein each wing is the same size, to form a symmetric Λ shape.

8. The motor of claim 7, wherein the stator includes two bars having opposite polarization sandwiched together, to form a bimorph Λ-shaped motor with 2-dimensional displacement by controlling two driving signals into four inputs having a predetermined phase shift difference.

9. The motor of claim 7, wherein a frequency of a resonance mode is determinable from a width of the bar and the angle between the wings.

10. The motor of claim 7, wherein the bar is made from a piezoelectric ceramic material $0.8Pb(Zr_dTi_{1-d})$-$0.2Pb[(1-c)\{(1-b)(Zn_{0.8}Ni_{0.2})_{1/3}(Nb_{1-a}Sb_a)_{2/3}$-$b(Li_{1/4}(Nb_{1-a}Sb_a)_{3/4})\}$-$c(Mn_{1/3}(Nb_{1-a}Sb_a)_{2/3})]O_3$, and a ranges from 0~0.3, b ranges from 0~0.4, c ranges from 0~0.4 and d ranges from 0.46~0.5.

11. The motor of claim 1, further comprising a third bar disposed between the free end of each wing, and each wing is the same size, to form a symmetric Δ shape.

12. The motor of claim 11, wherein the stator includes two bars having opposite polarization sandwiched together, to form a bimorph Δ-shaped motor having with 2-dimensional displacement by controlling using two driving signals into four inputs having a predetermined phase shift difference.

13. The motor of claim 11, wherein a frequency of a resonance mode is determinable from a width of the bar and the angle between the wings.

14. The motor of claim 11, wherein the bar is made from a piezoelectric ceramic material $0.8Pb(Zr_dTi_{1-d})$-$0.2Pb[(1-c)\{(1-b)(Zn_{0.8}Ni_{0.2})_{1/3}(Nb_{1-a}Sb_a)_{2/3}$-$b(Li_{1/4}(Nb_{1-a}Sb_a)_{3/4})\}$-$c(Mn_{1/3}(Nb_{1-a}Sb_a)_{2/3})]O_3$, and a ranges from 0~0.3, b ranges from 0~0.4, c ranges from 0~0.4 and d ranges from 0.46~0.5.

15. A symmetric piezoelectric ultrasonic motor having 2-dimensional positioning movement, the motor comprising:
   a stator, wherein said stator includes a bimorph piezoelectric ceramic bar and an electrode disposed on the bar, and the bar includes two wings of the same size that are separated by a predetermined angle to form a symmetric Λ-shape, wherein a free end of each wing forms a tip and a groove is located at a junction between each wing to increase a total displacement of the tip of each wing;
   a power input, wherein said power input applies a voltage to the stator to excite a bending mode vibration in the each of the wings, and the combined motion of each wing produces a 2 degree of freedom elliptical motion at the tip of each wing; and
   a load operatively connected to the stator, wherein a portion of the load in contact with the stator is driven in an x, z or diagonal direction to move the load linearly in 2-dimensional space through a frictional force between the load and the stator, due to the elliptical motion at the tip of each wing.

16. The motor of claim 15, wherein the stator includes two bars having opposite polarization sandwiched together, to form a bimorph Λ-shaped motor having a 2-dimensional displacement controlling two driving signals into four inputs having a predetermined phase shift difference.

17. A symmetric piezoelectric ultrasonic motor having 2-dimensional positioning movement, the motor comprising:
   a stator, wherein said stator includes a bimorph piezoelectric ceramic bar and an electrode disposed on the bar, and the bar includes two wings of the same size that are separated by a predetermined angle wherein a free end of each wing forms a tip, and a third bar is disposed between the free end of each wing, to form a symmetric Δ shape, wherein and a groove is located at a junction between each wing to increase a total displacement of the tip of each wing;
   a power input, wherein said power input applies a voltage to the stator to excite a bending mode vibration in the each of the wings, and the combined motion of each wing produces a 2 degrees of freedom elliptical motion at the tip of each wing; and
   a load operatively connected to the stator, wherein a portion of the load in contact with the stator is driven in x, z and diagonal directions to move the load linearly in 2-dimensional space through a frictional force between the load and the stator, due to the elliptical motion at the tip of each wing.

18. The motor of claim 17, wherein the stator includes two bars having opposite polarization sandwiched together, to form a bimorph Δ-shaped motor having a 2-dimensional displacement controlling using two driving signals into four inputs having a predetermined phase shift difference.

* * * * *

UNITED STATES PATENT AND TRADEMARK OFFICE
CERTIFICATE OF CORRECTION

PATENT NO. : 7,501,743 B2 Page 1 of 1
APPLICATION NO. : 11/741227
DATED : March 10, 2009
INVENTOR(S) : Kenji Uchino et al.

It is certified that error appears in the above-identified patent and that said Letters Patent is hereby corrected as shown below:

Column 1, Line 33, replace "male" with --make--
Column 5, Line 8, replace "cap" with --gap--

Signed and Sealed this

Eighteenth Day of August, 2009

David J. Kappos
*Director of the United States Patent and Trademark Office*